United States Patent
Kobayashi et al.

(10) Patent No.: US 7,223,636 B2
(45) Date of Patent: May 29, 2007

(54) MANUFACTURING METHOD OF SEMICONDUCTOR DEVICE AND SEMICONDUCTOR DEVICE

(75) Inventors: Yoshihiko Kobayashi, Tateshina (JP); Susumu Sato, Komoro (JP); Koki Tanimoto, Komoro (JP); Tomio Yamada, Komoro (JP); Hirokazu Nakajima, Saku (JP); Tomoaki Kudaishi, Komoro (JP); Yoshinori Shiokawa, Komoro (JP); Toshiharu Niitsu, Komoro (JP); Tsutomu Ida, Komoro (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/961,041

(22) Filed: Oct. 12, 2004

(65) Prior Publication Data

US 2005/0101052 A1  May 12, 2005

(30) Foreign Application Priority Data

Oct. 28, 2003  (JP) .............................. 2003-367435

(51) Int. Cl.
 *H01L 21/44* (2006.01)
(52) U.S. Cl. ...................... 438/110; 438/106; 438/460; 257/E21.599
(58) Field of Classification Search ................. 438/160
 See application file for complete search history.

(56) References Cited

U.S. PATENT DOCUMENTS

2002/0089052 A1* 7/2002 Yamaura et al. ............ 257/690

2005/0026335 A1* 2/2005 Omote et al. ............... 438/128

FOREIGN PATENT DOCUMENTS

| JP | 9-116091 | 5/1997 |
|---|---|---|
| JP | 11-31704 | 2/1999 |
| JP | 2002-208668 | 7/2002 |

* cited by examiner

*Primary Examiner*—Michael Lebentritt
*Assistant Examiner*—Cheung Lee
(74) *Attorney, Agent, or Firm*—Mattingly, Stanger, Malur & Brundidge, PC

(57) ABSTRACT

In a dividing method according to the present invention, a wiring board formed of ceramic is forced up (upper swing) by a lower clamp claw of a clamper, and some of a protruded wiring board portion protruding from a conveying chute is pressed against a support body to perform a first division under bending stress. Thereafter, the upward-located clamper is rotatably swung (lower swing) downward to allow an upper clamp claw to press down the protruded wiring board portion, thereby performing a reverse division at the first division section again as a second division. Since the second division allows a tensile force to act on a remaining and thin non-divided resin portion, the non-divided resin portion is torn off. Thus, the perfect division is enabled. Fractionalizing is done by a one-row division and an individual division so that each semiconductor device is formed.

15 Claims, 26 Drawing Sheets

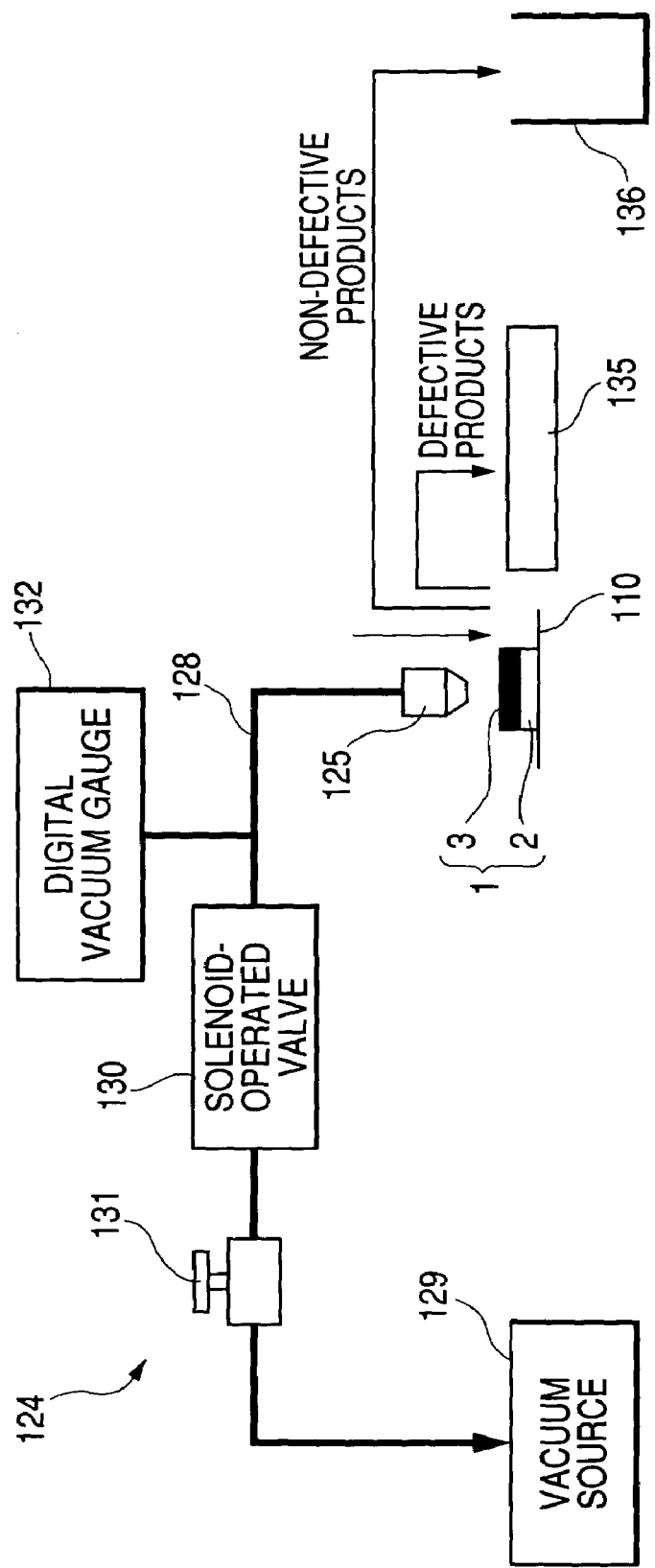

US 7,223,636 B2

MANUFACTURING METHOD OF SEMICONDUCTOR DEVICE AND SEMICONDUCTOR DEVICE

CROSS-REFERENCE TO RELATED APPLICATION

The present application claims priority from Japanese patent application No. 2003-367435 filed on Oct. 28, 2003, the content of which is hereby incorporated by reference into this application.

BACKGROUND OF THE INVENTION

The present invention relates to a method of manufacturing a semiconductor device such as a hybrid integrated circuit device (hybrid IC) and a semiconductor manufacturing apparatus, and to, for example, a technique effective if applied to the manufacture of a semiconductor device built in a cellular phone.

As one manufacturing method of a semiconductor device such as a hybrid integrated circuit device, there is known, for example, a technique for mounting a bare chip and other parts over unit sections of a package base substrate, which can be taken or picked up in multi form, thereafter sealing the bare chip and other parts with an insulating resin to form a sealing resin and then cutting the package base substrate together with the resin to thereby manufacture semiconductor devices based on the unit sections (see, for example, a patent document 1 (Japanese Unexamined Patent Publication No. Hei 11(1999)-31704)).

The patent document 1 has pointed out that a problem arises in that when the sealing resin is formed by a potting method, the surface of the sealing resin is hard to be flattened, and when a semiconductor device manufactured as a result thereof is surface-mounted to a circuit substrate, sorbability based on a vacuum adsorption nozzle is degraded.

On the other hand, there is known a semiconductor device having a structure wherein a semiconductor chip and chip parts are mounted over one surface of a module substrate and covered with an insulating resin to form a sealing or encapsulating section. When, in this case, a semiconductor device in which chip parts are fixed to a module substrate by solder connections and an encapsulating section is formed of a high elastic resin, is connected to a mounting board by solder reflow, solder of the solder-connected portion in the encapsulating section is remelted so that a malfunction such as a short occurs. The short occurs due to the fact that, for example, when solder is remelted, expanded pressure produced due to its melting peels or strips an interface between each chip part and a resin for forming the encapsulating section or an interface between the resin and the module substrate, and solder flows into it so that electrode terminals at both ends of the chip part are connected by solder. Therefore, there has been proposed a semiconductor device wherein in place of the high elastic resin, a resin (e.g., resin having an elastic modulus of 200 MPa or less at a temperature of 150° C. or more: e.g., silicone resin) having low elastic modulus is used to form an encapsulating section. The semiconductor device is capable of preventing a short because even if solder in the encapsulating section is remelted upon mounting reflow, pressure produced due to its melting expansion is relaxed by the low elastic resin (see, for example, a patent document 2 (Japanese Unexamined Patent Publication No. 2000-208668)).

Also the patent document 2 has described that a resin is applied onto the full surface of a multi-pickup substrate by a printing method and cured by baking to form a batch encapsulating section, and thereafter the multi-pickup substrate is subjected to primary division inclusive of the batch encapsulating section to manufacture semiconductor devices. As the resin, a silicone resin or a low elastic epoxy resin is used. As to the division, a one-row division (primary division) and fractionalization (secondary division) are performed twice, whereby a module (semiconductor device) is manufactured.

The patent document 2 has described that when a soft silicone resin is used upon division, the division is not perfectly done and hence a non-divided spot occurs, and the division is carried out by laser or dicing.

On the other hand, a semiconductor device such as a high frequency power amplifier device employed in a transmitting unit is known as a semiconductor device mounted over a mounting board of a cellular phone. The present semiconductor device has a structure wherein, for example, an electronic part comprising active parts (active elements) such as a transistor, etc. and passive parts (passive elements) such as a resistor, a capacitor, etc. is mounted over the upper surface of a module substrate having a wiring board structure. A plurality of electrode terminals (external electrode terminals) are provided over the back surface of the module substrate, and hence the present semiconductor device results in a surface-mounting semiconductor device. The module substrate is formed of a low temperature calcined substrate (low temperature calcined multilayer wiring board) formed of ceramic (see, for example, a patent document 3 (Japanese Unexamined Patent Publication No. Hei 9(1997)-116091)).

SUMMARY OF THE INVENTION

The semiconductor device built in a cellular phone is used in a high frequency region. In a semiconductor device (hybrid integrated circuit device) including a filter high frequency circuit, a filter wiring is formed in a substrate by calcination upon its manufacture. In this case, a material low in impedance such as copper (Cu), silver (Ag) is used to form the filter wiring. Since Cu and Ag are low in melting point, there is a need to fabricate the substrate by low temperature calcination. Thus, the substrate makes use of a low temperature calcined substrate (low temperature calcined multilayered wiring board).

In the hybrid integrated circuit device, passive elements such as a chip resistor, a chip capacitor or the like are mounted over wirings (lands) of the module substrate by solder connections. This solder is remelted upon connecting a semiconductor device to a mounting board by reflow (temporary heat treatment), thus leading to such a short as described above. Thus, in order to prevent the short caused by solder remelted within the encapsulating body, the present applicant uses such a silicone resin or low elastic epoxy resin as described in the patent document 2 as a resin for forming the encapsulating body. Then, the multi-pickup substrate (wiring board) is divided together with the resin layer for forming the encapsulating body (one-row division based on the primary division, and fractionalization by secondary division) to thereby fabricate a semiconductor device.

In this case, the division is done using small grooves (division lines) for division, which are defined in the lower surface of the wiring board. As described even in the patent document 2, however, when a resin layer provided over the full surface of a wiring board 150 is formed of a silicone resin layer 151 as shown in FIG. 34, a non-divided resin portion 152 occurs.

An object of the present invention is to provide a method of manufacturing a semiconductor device using a silicone resin or a low elastic epoxy resin as an encapsulating material, which is capable of reliably performing division in such a manner that a non-divided resin portion does not remain, and a semiconductor manufacturing apparatus.

Another object of the present invention is to provide a method of manufacturing a semiconductor device in which an encapsulating body that covers the full surface of a wiring board is formed by printing a silicone resin or a low elastic epoxy resin, which method is capable of checking whether the flatness of the surface of the encapsulating body is good or bad, and a semiconductor manufacturing apparatus.

The above, other objects and novel features of the present invention will become apparent from the description of the present specification and the accompanying drawings.

Summaries of the representative ones of the inventions disclosed in the present application will be explained in brief as follows:

(1) A method of manufacturing a semiconductor device, according to the present invention comprises the steps of:

(a) preparing a wiring board having device mounting sections and conductor layers in a plurality of areas of a first surface and having external electrode terminals in a second surface opposite to the first surface, and wherein the respective areas are brought into fractionization by division at a final manufacturing stage;

(b) mounting electronic parts in the plurality of areas inclusive of solder connections;

(c) covering the plurality of areas with an insulating resin to form a resin layer;

(d) preparing a division mechanism having a base (conveying chute), a first device part (support body) which faces an upper surface of the conveying chute with a predetermined interval interposed therebetween, and a second device part (clamper) disposed in such a manner that an upper clamp claw and a lower clamp claw are respectively located on the upper and lower surface sides of a protruded wiring board portion of the wiring board placed over the conveying chute such that part thereof protrudes to the division position side out of one edge of the conveying chute;

(e) setting the wiring board to the upper surface of the conveying chute in such a manner that a divided portion of the wiring board coincides with the division position;

(f) as a first dividing step, rotating the clamper relative to the support body to swing the protruded wiring board portion in an upward direction, thereby dividing the wiring board at a point where it contacts a fulcrum provided in the support body; and (g) as a second dividing step, rotating the clamper in the direction opposite to the direction of rotation in said step (f) to swing the protruded wiring board portion downward and pressing the wiring board against the conveying chute to divide the wiring board again at a point divided by the first dividing step, wherein the wiring board forms strip bodies in each of which the areas are arranged in a row, according to a primary dividing process based on the steps (e) through (g), and wherein thereafter the strip body is divided every areas according to a secondary dividing process based on the steps (e) through (g) to thereby manufacture semiconductor devices.

The resin layer is formed by printing a resin (silicone resin) having an elastic modulus of 200 MPa or less at a temperature of 150° C. or more onto the wiring board and effecting defoaming processing and curing processing thereon. In the step (f), the clamper placed in an origin position in a state of pinching the protruded wiring board portion of the wiring board placed over the upper surface of the conveying chute from above and below in a non-contact state, is rotated by about 80° to 120° around the fulcrum in the upward direction. In the next step (g), the clamper is rotated in the direction opposite to the direction of rotation in the step (f) by an angle obtained by adding a rotational angle ranging from 10° to 45° to the rotational angle in the step (f).

A semiconductor manufacturing apparatus has such a configuration as to have a predetermined space between the lower surface of the support body and the surface of the resin layer of the wiring board placed over the conveying chute. In the clamper placed in such an origin position that the upper clamp claw and the lower clamp claw are positioned on the upper and lower surface sides of the protruded wiring board portion of the wiring board in a set state, which is placed over the conveying chute and protrudes from one edge of the conveying chute, the upper clamp claw and the lower clamp claw are positioned with a predetermined gap defined between the protruded wiring board portion and each of the upper clamp claw and lower clamp claw. In the step (f), when the clamper is rotated in the upward direction relative to the support body, the protruded wiring board portion is forced up by the lower clamp claw of the clamper in a state in which the upper clamper claw is not brought into contact with the protruded wiring board portion, thereby dividing the wiring board. In the step (g), when the clamper is rotated in the downward direction with respect to the support body, the protruded wiring board substrate portion is forced up by the upper clamp claw of the clamper in a state in which the upper clamp claw is not brought into contact with the protruded wiring board portion to thereby divide the wiring board perfectly.

The following semiconductor manufacturing apparatus is used in such a manufacturing method of the semiconductor device. The semiconductor manufacturing apparatus divides a wiring board which has electronic parts respectively mounted in plural areas of a first surface and has external electrode terminals in a second surface corresponding to each of the areas and corresponding to a surface opposite to the first surface, and in which the plurality of areas are covered with an insulating resin layer, according to primary dividing processing on the basis of control of a control system to form a strip body in which the areas are arranged in a row, and thereafter divides the strip body every areas according to secondary dividing processing to thereby manufacture semiconductor devices. A one-row division mechanism for performing the primary dividing process and an individual division mechanism for performing the secondary diving processing respectively have a conveying chute which places the wiring board over its upper surface such that the resin layer assumes an upper surface, a support body which faces the upper surface of the conveying chute and faces the resin layer of the wiring board placed over the conveying chute, and a clamper which is disposed in such a manner that an upper clamp claw and a lower clamp claw are respectively disposed on the upper and lower surface sides of a protruded wiring board portion of the wiring board placed over the conveying chute in such a way that part thereof protrudes to the division position side out of one edge of the conveying chute, and are rotatably controlled in upward and downward direction respectively. In the primary dividing processing and the secondary dividing processing, the wiring board is placed over and set to the upper surface of the conveying chute such that each divided portion of the wiring board coincides with the division position. Further, the protruded wiring board portion that protrudes from the conveying chute is placed between the upper clamp claw and the lower clamp claw. Next, the clamper is rotated in the upward direction with respect to the support body to swing the protruded wiring board portion in the upward direction to allow it to contact a fulcrum provided in the support body, thereby perform a first division for dividing the wiring board. The clamper is rotated in the direction opposite to the direction of rotation in the first division to swing the protruded wiring board portion below the upper surface of the conveying chute, thereby performing a second division for dividing the wiring board at the corresponding point divided by the first division.

The origin position where the work of the clamper of the division mechanism is started, corresponds to a position where in a state in which the wiring board is set to the upper surface of the conveying chute, the upper clamp claw and the lower clamp claw are located above and below the protruded wiring board portion in a non-contact state and kept in its nipped state. The clamper is configured so as to be capable of being rotated by at least 80° to 120° from the origin position about the fulcrum in the upper direction and being rotated in the forward and reverse directions over at least about 10 to 45 degrees in the downward direction.

Also the semiconductor manufacturing mechanism includes a control system that controls the entirety, a loader which supplies the wiring board to the one-row division mechanism, a conveying mechanism which conveys the strip body divided and formed by the one-row division mechanism in its longitudinal direction and supplies it to the individual division mechanism, an individual conveying mechanism which sequentially and individually conveys semiconductor devices divided and fractionalized by the individual division mechanism to one to plural stages, and a pickup mechanism which holds the semiconductor device at the final stage by a tool under vacuum adsorption, conveys each non-defective product to a non-defective storage unit under the control of the control system, and conveys each defective product to a defective product storage unit.

The pickup mechanism has a tool which adsorbs under vacuum a semiconductor device onto a lower end surface, a drive unit which holds the tool and three-dimensionally moves and controls the tool, a vacuum source connected to the tool via a tubing or pipe arrangement, a solenoid-operated valve which is connected to the tubing in a communicating state and performs an on/off operation by the control system, and a digital vacuum meter which is connected between the solenoid-operated valve and the tool and measures the degree of vacuum in the tool. Information about the degree of vacuum measured by the digital vacuum meter is transmitted to the control system. The control system controls the pickup mechanism based on the information about the degree of vacuum. When the degree of vacuum is greater than or equal to the reference degree of vacuum, the control system conveys each semiconductor device to the non-defective storage unit. When the degree of vacuum is less than the reference degree of vacuum, the control system conveys each semiconductor device to the defective product storage unit.

Advantageous effects obtained by representative ones of the inventions disclosed in the present application will be explained in brief as follows:

(1) A resin layer formed by printing of a silicone resin is subjected to defoaming processing and curing processing (bake processing) after its printing. A heavy substance such as a filler contained in a resin at the defoaming processing long in processing time sinks from the upper surface side to the wiring board side at its lower surface. As a result, the surface of the resin layer is brought to a layer of a resin component hard to tear off. Thus, a compression force merely acts on the layer of the resin component in the surface layer of the resin layer even if the wiring board is divided, in the case of such a division that the wiring board is folded back to the resin layer side. Therefore, the resin portion remains without the division of the wiring board (non-divided resin portion remains). In the dividing method according to the present invention, a wiring board formed of ceramic is forced up (upper swing) by means of a lower clamp claw of a clamper, and some of a protruded wiring board portion that protrudes from a conveying chute is pressed against a support body to carry out a first division under bending stress. Thereafter, the upward-located clamper is rotatably swung (lower swing) downward to allow an upper clamp claw to press down the protruded wiring board portion, thereby performing a reverse division at the first division section again as a second division. Since the second division allows a tensile force to act on a remaining and thin non-divided resin portion, the non-divided resin portion is torn off. Thus, the perfect division is enabled. Fractionalizing is done by a one-row division and an individual division so that each semiconductor device is manufactured.

(2) A pickup mechanism, which conveys products brought to semiconductor devices by being fractionized, vacuum-adsorbs and holds a semiconductor device at a final stage by a tool but measures the degree of vacuum in its held state. Then, the pickup mechanism is controlled based on information about the degree of vacuum. When the measured degree of vacuum is greater than or equal to the reference degree of vacuum, the pickup mechanism conveys the semiconductor devices to the corresponding non-defective product storage unit. When the degree of vacuum is less than the reference degree of vacuum, the pickup mechanism conveys the semiconductor devices to the corresponding defective product storage unit. Thus, only products in each of which the flatness of the surface of an encapsulating body is satisfactory, can be shipmented. As a result, the pickup of each semiconductor device is done reliably upon the work of mounting of the semiconductor device by a user, thus making it possible to carry out satisfactory mounting.

BRIEF DESCRIPTION OF THE DRAWINGS

FIG. 27 is a typical view schematically showing a pickup mechanism for detecting whether planarization of each of products is good or bad, which is employed in the semiconductor manufacturing apparatus;

DETAILED DESCRIPTION OF THE PREFERRED EMBODIMENTS

Figure 1A:
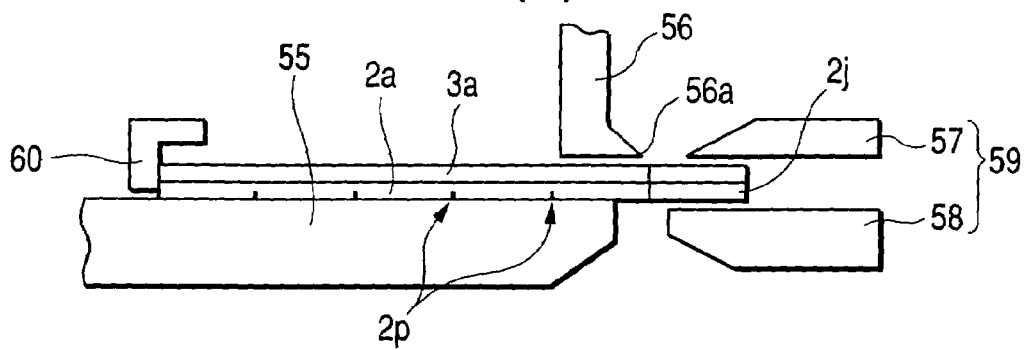
FIGS. 1(a) to 1(c) are typical views showing a method of manufacturing a semiconductor device, according to a first embodiment of the present invention.

Preferred embodiments of the present invention will hereinafter be described in detail with reference to the accompanying drawings. Incidentally, elements each having the same function are given like reference numerals through all the drawings for describing the embodiments of the invention, and their repetitive description will be omitted.

First Preferred Embodiment

The first embodiment will explain an example in which the present invention is applied to the manufacture of a semiconductor device (hybrid integrated circuit device) built in a cellular phone. FIGS. 1 through 29 are drawings related to a method of manufacturing a semiconductor device, showing the first embodiment of the present invention, and a semiconductor manufacturing apparatus. FIGS. 2 through 7 are drawings related to the semiconductor device manufactured by the first embodiment. FIGS. 1(a) to 1(c) and FIGS. 8 through 29 are drawings related to the semiconductor manufacturing apparatus.

Figure 2:
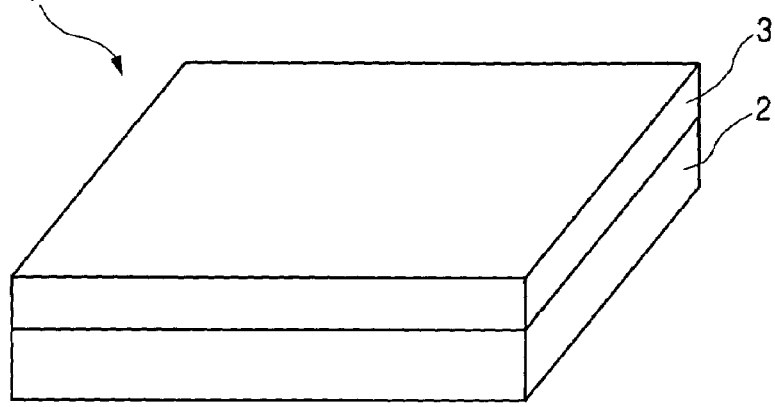
FIG. 2 is a perspective view illustrating an external appearance of a semiconductor device manufactured by the semiconductor device manufacturing method according to the first embodiment of the present invention.

As shown in FIG. 2, the semiconductor device (hybrid integrated circuit device) 1 manufactured by the semiconductor device manufacturing method according to the present embodiment comprises, in appearance, a module substrate 2 constituted of a square-shaped low temperature calcined laminated substrate, and an encapsulator or encapsulating body 3 formed of an insulating resin that covers the upper surface of the module substrate 2.

A low elastic resin is used as the resin for forming the encapsulating body 3. As the low elastic resin, a resin having an elastic modulus of 200 MPa or less at a temperature of 150° C. or more, or a resin having an elastic modulus of over 1 MPa to under 200 MPa at the temperature of 150° C. or more and an elastic modulus of over 200 MPa at a temperature of 25° C. is used. A silicone resin is known as the resin having the elastic modulus of 200 MPa or less at the temperature of 150° C. or more. An epoxy resin is known as the resin having the elastic modulus of over 1 MPa to under 200 MPa at the temperature of 150° C. or more and the elastic modulus of over 200 MPa at the temperature of 25° C. In the present embodiment, the encapsulating body 3 is formed of the silicone resin.

Figure 3:
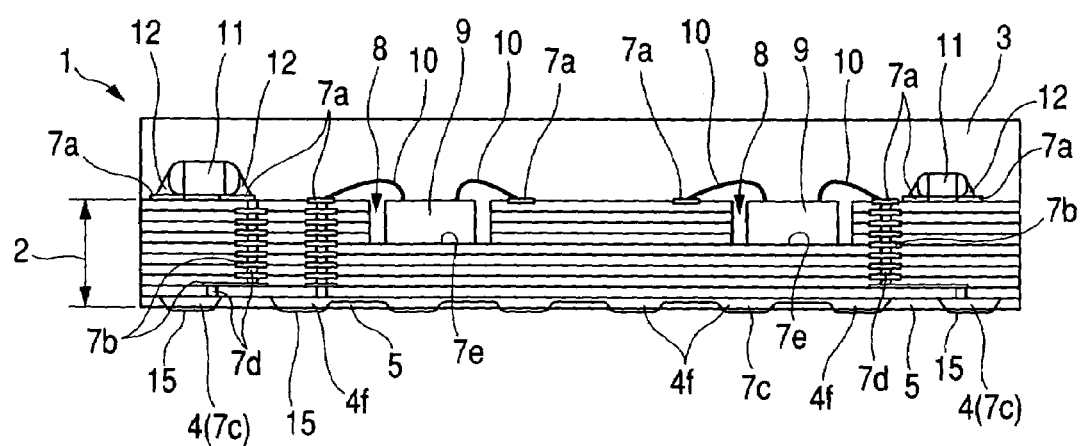
FIG. 3 is a typical enlarged cross-sectional view of the semiconductor device.
Figure 4:
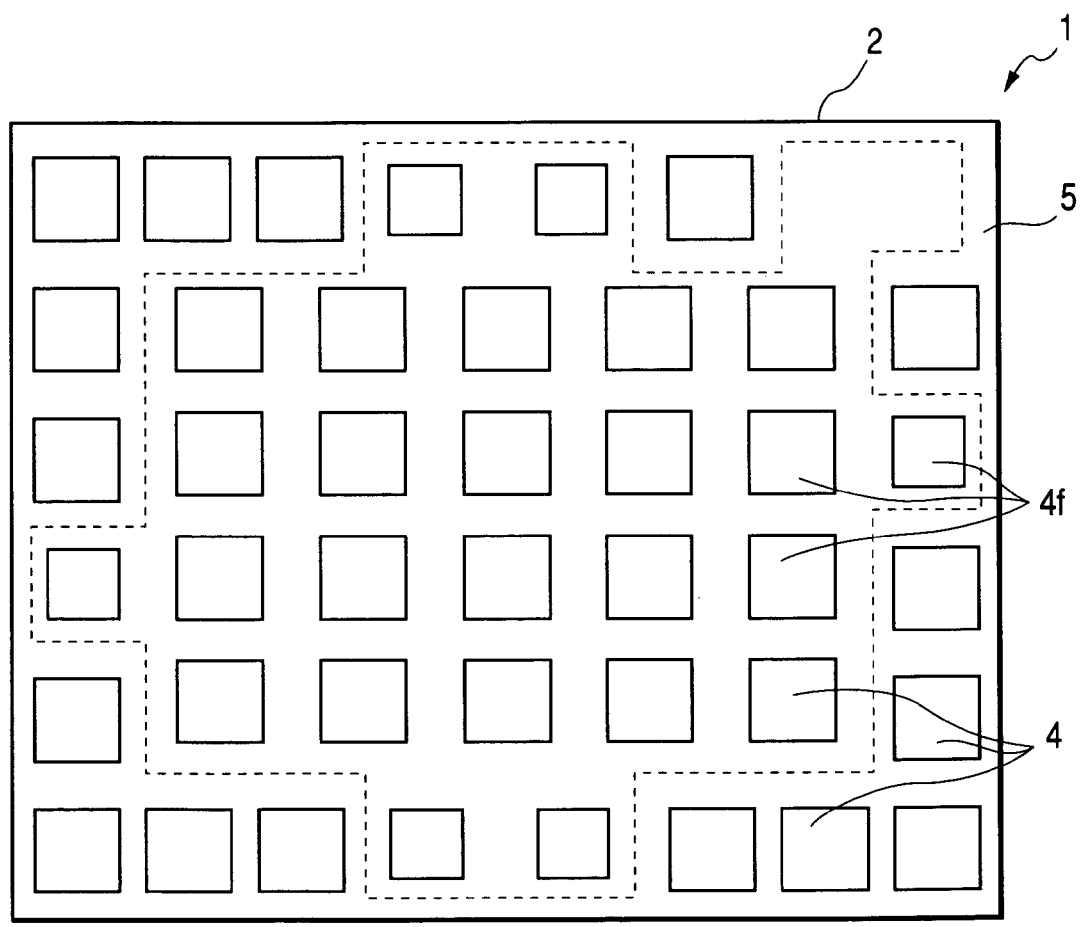
FIG. 4s a typical enlarged bottom view of the semiconductor device.

As shown in FIG. 3, a plurality of external electrode terminals 4 are provided over the back surface of the encapsulating body 3. FIG. 4 is a view showing the back surface of the semiconductor device 1. Large and small square portions respectively correspond to the external electrode terminals 4. The edges of the external electrode terminals 4 are covered with an insulating film 5 comprising an alumina coat film provided over the back surface of the encapsulating body 3. And portions uncovered with the insulating film 5 serve as substantial external electrode terminal portions that contribute to connections. In FIG. 4, the external electrode terminals 4 lying in an area surrounded by a dotted lie frame correspond to ground electrodes respectively.

The thickness of the semiconductor device 1 is about 1.6 mm, and the thickness of the module substrate 2 is about 0.75 mm, for example. The module substrate 2 is a low temperature calcined substrate (low temperature calcined alumina ceramic substrate) and corresponds to a substrate having a laminated structure as shown in FIG. 3. Conductor layers 7*a*, 7*b* and 7*c* are respectively provided in the upper surface, middle layer and lower surface of the module substrate 2. Conductors 7*d*, which extend through the respective layers of the module substrate 2 and electrically connect any of the conductor layers 7*a*, 7*b* and 7*c*, are provided. Further, recesses 8 are defined in the upper surface of the module substrate 2 at predetermined spots. A device mounting conductor layer 7*e* is provided even at the bottom of each of these recesses 8. A semiconductor chip (active part: active element) 9 is fixed (mounted) onto its corresponding conductor layer 7*e* through an unillustrated adhesive interposed therebetween. Electrodes placed over the upper surface of each semiconductor chip 9 and the predetermined conductor layers 7*a* placed in the upper surface of the module substrate 2 are respectively electrically connected to one another by conductive wires 10. Respective pairs of conductor layers 7*a* are provided in the upper surface of the module substrate 2. Electrode portions of chip type electronic parts 11 are electrically connected via solder 12 to these pairs of conductor layers 7*a* respectively. The chip type electronic parts 11 are passive parts (passive elements) such as a chip resistor, a chip capacitor, a chip inductor, etc. Circuit elements such as the active elements, passive layers, etc. are mounted over a first surface of the module substrate 2 as described above.

On the other hand, the insulating film 5 is selectively formed in the lower surface of the module substrate 2. The insulating film 5 partly cover the respective conductor layers 7*c*. Square-shaped external electrode terminals, which form power supply terminals, signal terminals, etc., are arranged in a row along the edges of the module substrate 2 although they are discontinuous in mid course.

As shown in FIG. 4, a plurality of ground electrodes 4*f*, which also serve as external electrode terminals, are provided from the interior of the module substrate 2 to, partly, its each edge. The ground electrodes 4*f* are equivalent to ones obtained by exposing, in subsection form, the conductor layers 7*c* formed in the lower surface of the module substrate 2 over a wide area by the insulating film 5. A plating film 15 is formed over the surface of each of the external electrode terminals 4 exposed from the insulating film 5 (see FIG. 3). Although not shown in the figure, the plating film 15 comprises a first plating film corresponding to a lower layer and a second plating film formed over the first plating film. For example, the conductor layer 7*c* is equivalent to one formed by printing paste containing Pt over Ag and calcining it. The first plating film is Au and the second plating film is Ni. This structure is similar even to the ground electrodes 4*f*.

Figure 5:
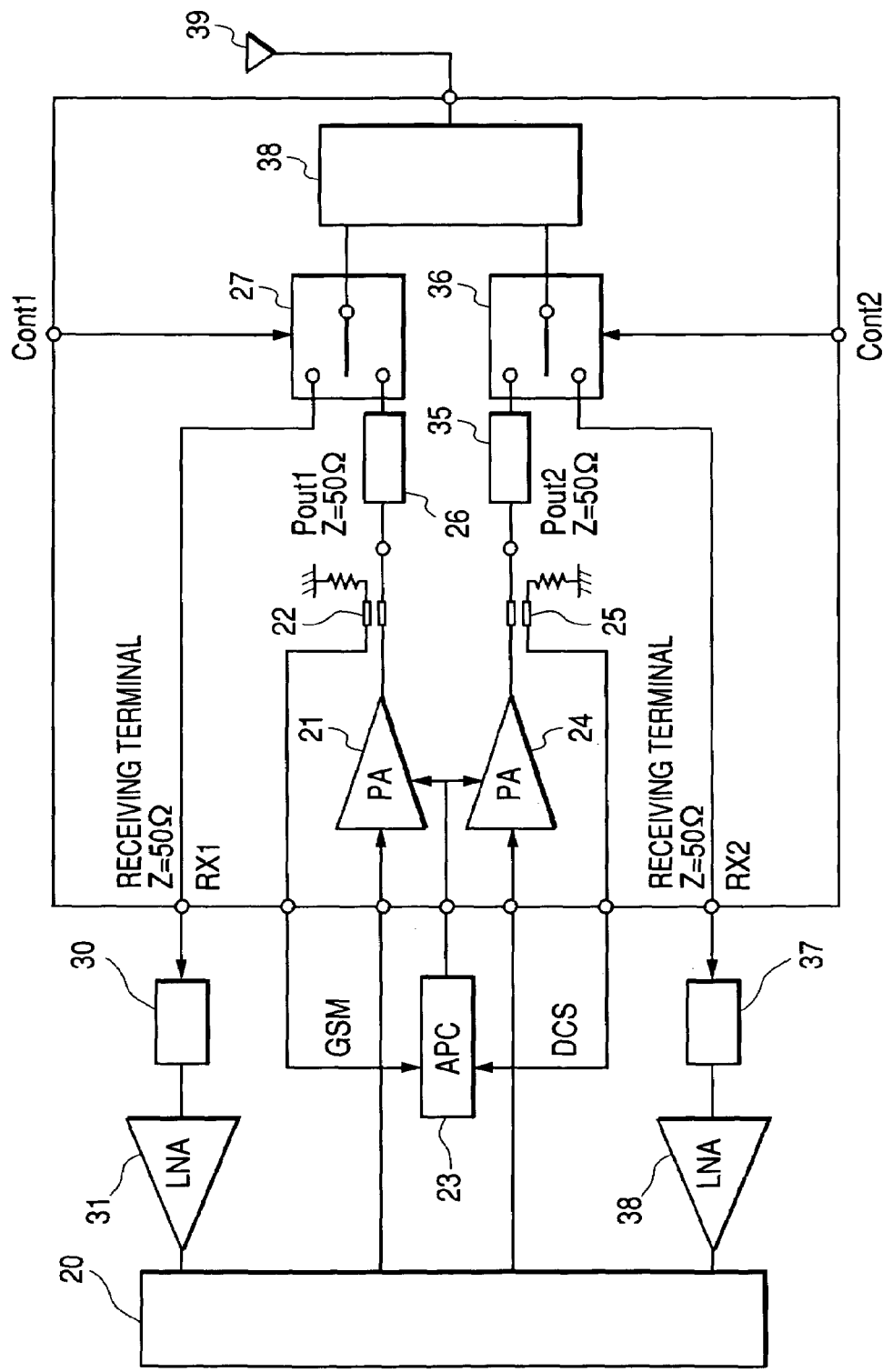
FIG. 5 is a block diagram showing a circuit configuration of part of a cellular phone with the semiconductor device built therein.

Described specifically, the semiconductor device 1 according to the present embodiment is a hybrid integrated circuit device 1 containing a power amplifier device (high frequency power amplifier device), a duplexer, etc., which is operated at an operating frequency of 800 MHz or higher. Thus, a description will be made of a cellular phone (wireless communication device) incorporating the semiconductor device 1 (high frequency power amplifier device) according to the present embodiment therein. FIG. 5 is a block diagram showing part of a dualband wireless communication device. This is a block diagram showing a high frequency power amplifier device having an amplification system for a GSM system and an amplification system for a DCS system in a wireless communication system, and part of a cellular phone of a dualband system capable of these two communication systems.

The block diagram of FIG. 5 shows a part or section from a high frequency signal processing IC (RF linear) 20 to an antenna 39. As shown in the same figure, a GSM signal sent from the high frequency signal processing IC 20 is transmitted to an amplifier (PA) 21 for GSM, and the output of the amplifier 21 is detected by a coupler 22. The signal detected by the coupler 22 is fed back to an automatic power control circuit (APC circuit) 23. The APC circuit 23 is operated based on the detected signal to control the amplifier 21. Similarly, a DCS signal sent from the high frequency signal processing IC 20 is transmitted to an amplifier (PA) 24 for DCS. The output of the amplifier 24 is detected by a coupler 25. The signal detected by the coupler 25 is fed back to the APC circuit 23. The APC circuit 23 is operated based on the detected signal to control the amplifier 24.

The output of the amplifier 21 is transmitted to a filter 26 through an output terminal Pout1 and inputted to a duplexer 38 through a transmit-receive changeover switch 27. The antenna 39 is connected to an output terminal of the duplexer 38. Similarly, the output of the amplifier 24 is transmitted to a filter 35 through an output terminal Pout2 and inputted to the duplexer 38 through a transmit-receive changeover switch 36.

The transmit-receive changeover switches 27 and 36 are changed over in response to control signals sent from control terminals cont1 and cont2 to send out a signal received by the antenna 39 to receiving terminals RX1 and RX2. These signals are transmitted to the high frequency signal processing IC 20 through the filters 30 and 37 and low noise amplifiers (LNAs) 31 and 38. The wireless communication device enables GSM and DCS communications.

As shown in FIG. 5, the semiconductor device 1 according to the present embodiment has a structure wherein the amplifiers (PAs) 21 and 24, the couplers 22 and 25, the filters 26 and 35, the transmit-receive changeover switches 27 and 36 and the duplexer 38 are formed integrally.

Figure 6:
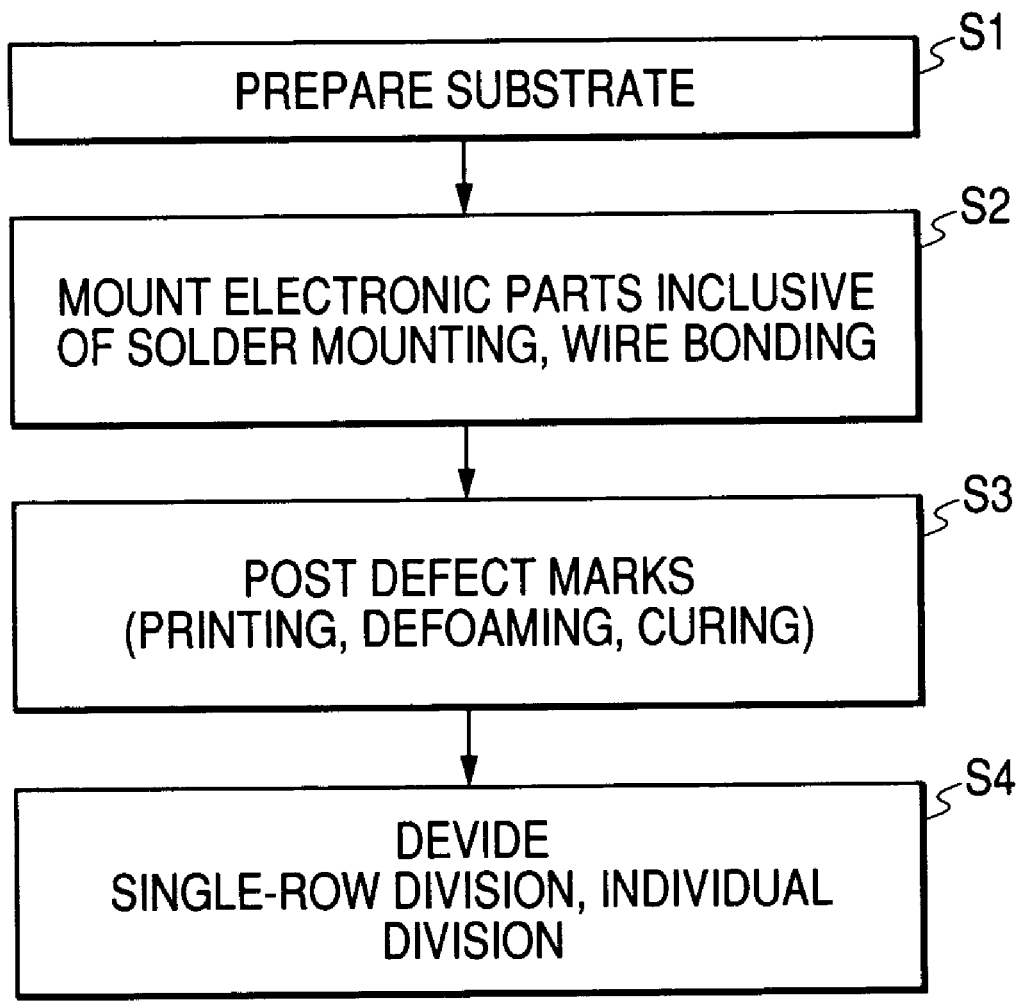
FIG. 6 is a flowchart for describing the method of manufacturing the semiconductor device, according to the first embodiment of the present invention.

As shown in FIG. 6, such a semiconductor device 1 is manufactured via process steps for preparing a substrate (S1), mounting electronic parts (S2), forming a resin layer (S3) and performing division (S4). FIGS. 7(*a*) through 7(*c*) are respectively typical cross-sectional views showing the state of the substrate in the respective steps. A substrate 2*a* comprising a low temperature calcination ceramic wiring board for forming the module substrate 2 shown in the description of the structure of the semiconductor device 1 is prepared (S1).

The substrate 2*a* is configured as a pattern in which square-shaped areas (product forming sections) for manufacturing one semiconductor device are arranged in line in matrix form. FIGS. 7(*a*) to 7(*c*) show part of the substrate 2*a*, i.e., a single or unitary area (product forming section) 2*c*. A module substrate is formed by dividing and fractionalizing the unitary area. Since a wiring structure of the unitary area 2*c* corresponds to the already-described structure of module substrate, it will be omitted.

Figure 7A:
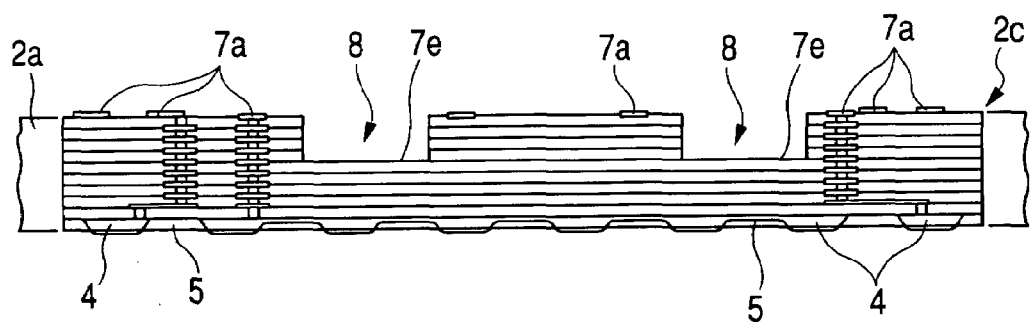
FIGS. 7(a) to 7(c) are cross-sectional views for describing respective steps showing the method of manufacturing the semiconductor device.

As shown in FIG. 7(a), recesses 8 are defined in a first surface of each area (product forming section) 2c. A conductor layer 7e is provided at the bottom of each recess 8. Conductor layers 7a for connecting electrodes at both ends of each chip type electronic part and wires are formed over the first surface. External electrode terminals 4 are provided at predetermined spots of the opposite surface, i.e., second surface of each area 2c of the substrate 2a. Areas other than the external electrode terminals 4 are covered with an insulating film 5.

Figure 7B:
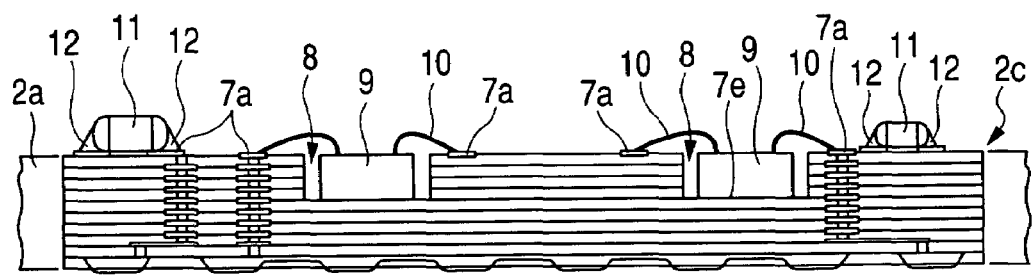

Thus, as shown in FIG. 7(b), the mounting of the electronic parts is performed. That is, a semiconductor chip 9 is fixed onto its corresponding conductor layer 7e at the bottom of each recess 8. Further, respective electrodes provided over the upper surface of each semiconductor chip 9 and its peripheral conductor layers 7a are connected by conductive wires 10. Also electrode portions at both ends of each chip type electronic part 11 are connected to the pair of conductive layers 7a by solder 12. The mounting of the electronic parts (S2) is contained in the mounting of the semiconductor chips 9 and the mounting of the chip type electronic parts 11 and also includes electrical connections among the conductor layers 7a and 7e of the substrate 2a, the semiconductor chips 9 and the chip type electronic parts 11.

Figure 7C:
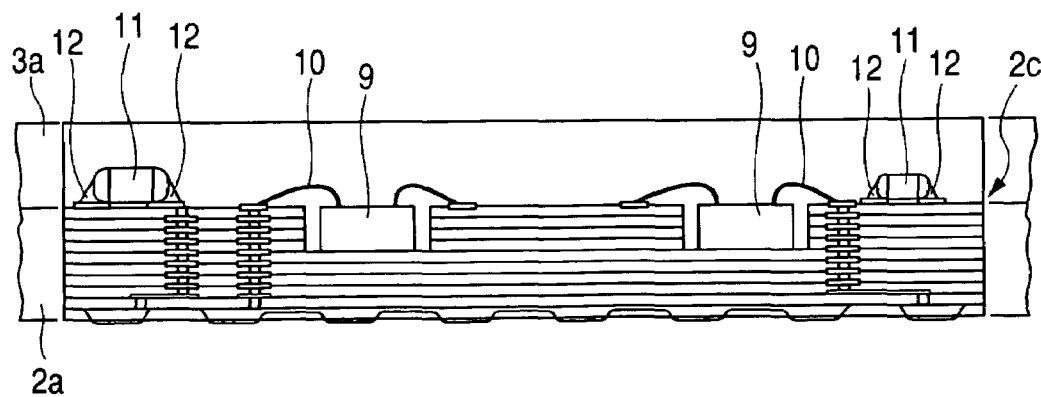

Next, as shown in FIG. 7(c), a resin layer 3a is formed over a first surface of the substrate 2a (S3). The resin layer 3a is formed by printing a resin having an elastic modulus of 200 MPa or less at a temperature of 150° C. or higher to a predetermined thickness (e.g., thickness ranging from 0.75 mm to 0.8 mm), effecting defoaming processing on it and performing its curing processing (bake processing). Described specifically, a silicone resin is printed. After its printing, bubbles contained in the resin layer are defoamed (deaerated). This defoaming processing is performed by leaving the substrate 2a under a vacuum atmosphere (53 hpa) for about 10 to 20 minutes. The bake processing is carried out by leaving the substrate 2a under an atmosphere at 150° C. for 90 minutes.

The silicone resin is used to prevent a short with remelting of solder in an encapsulating body upon mounting of the semiconductor device on a mounting board by reflow. To this end, a resin having an elastic modulus of over 1 MPa to under 200 MPa at a temperature of 150° C. or more and an elastic modulus of over 200 MPa at a temperature of 25° C. can also be used. A low elastic epoxy resin is used as the resin.

Next, a fail mark is applied onto an exposed surface of the substrate 2a formed with the resin layer 3a, i.e., a second surface thereof with respect to a defective product by an inkjet method or the like. The fail mark is detected in a subsequent process and a product with the fail mark applied thereon is eliminated. The fail mark is applied onto the same position as the second surface of the substrate 2a by the ink jet method or the like after detection of a fail mark (fail mark applied for a substrate initial failure and an assembly failure in advance) applied onto the upper surface of the substrate by recognition before printing in S3 of FIG. 6.

Next, the substrate 2a is divided (S4) together with the resin layer 3a to form such a semiconductor device 1 as shown in FIG. 3. This division is performed according to a primary dividing process and a secondary dividing process. The primary dividing process is of a one-row dividing process and corresponds to such division of the substrate 2a as to form a strip body in which areas thereof are arranged in a row. The secondary dividing process is of an individual dividing process and is equivalent to such division as to sequentially divide the strip body at the boundaries among the areas and bring it into fractionalization thereby to form the semiconductor device 1.

Figure 9:
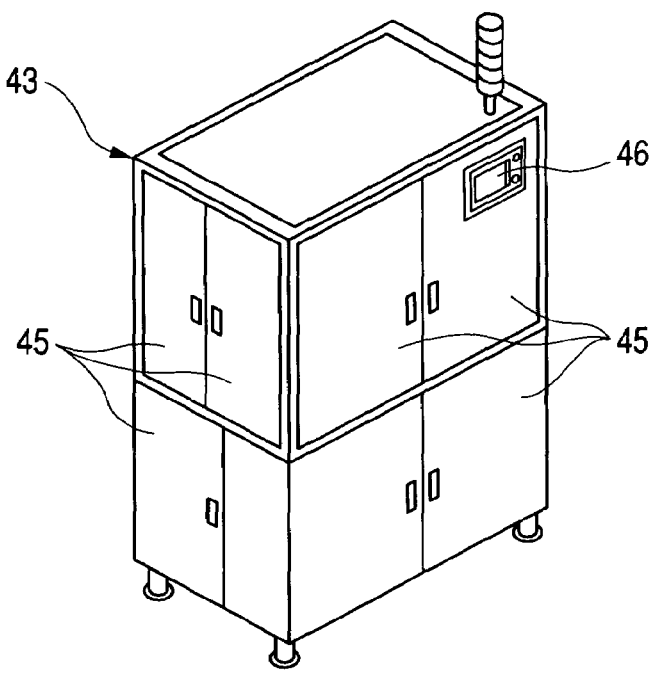
FIG. 9 is a perspective view showing an external appearance of a semiconductor manufacturing apparatus employed in the manufacture of the semiconductor device according to the first embodiment of the present invention.

In the present embodiment, the division at each of the primary dividing process (one-row division) and the secondary dividing process (individual division) is performed by such a semiconductor manufacturing apparatus 43 as shown in FIG. 9. The semiconductor manufacturing apparatus 43 has its front face and a plurality of openable/closable doors 54. A control panel 46 is provided at its front face. Although not shown in the drawing in particular, the semiconductor manufacturing apparatus 43 is provided thereinside with a control system capable of, for example, effecting arithmetic processing on drive control of respective mechanism portions and detected information (measured information) obtained by various detections and driving and controlling respective portions, based on the information.

Figure 8:
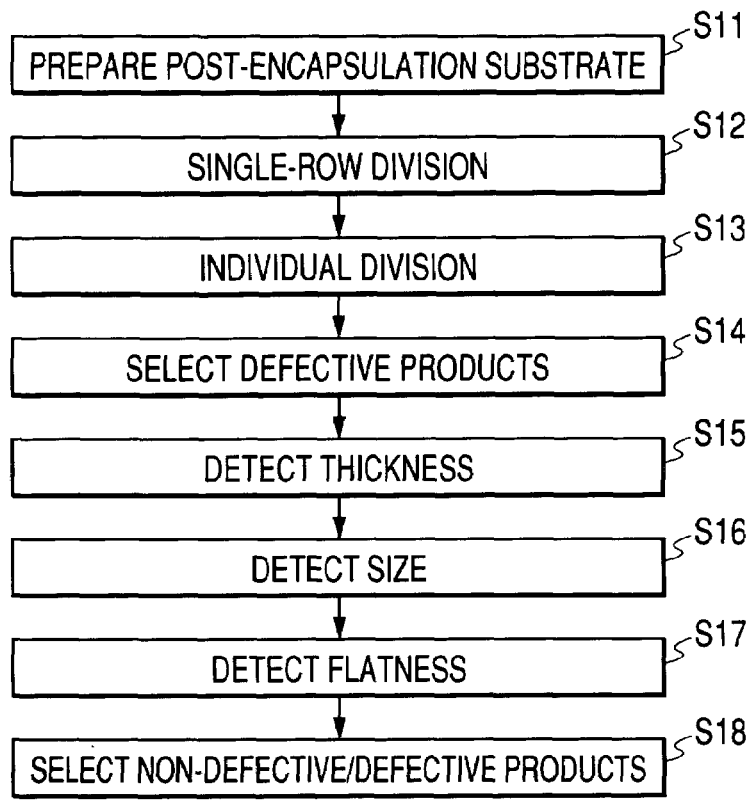
FIG. 8 is a flowchart showing a substrate dividing method at the manufacture of the semiconductor device.

As indicated by a flowchart shown in FIG. 8, the semiconductor manufacturing apparatus 43 is capable of performing respective step operations such as preparation of a post-encapsulation substrate (S11), one-row division (S12), individual division (S13), selection of a defective product (S14), thickness detection (S15), size detection (S16), flatness detection (S17), and selection of non-defective/defective product (S18).

Figure 10:
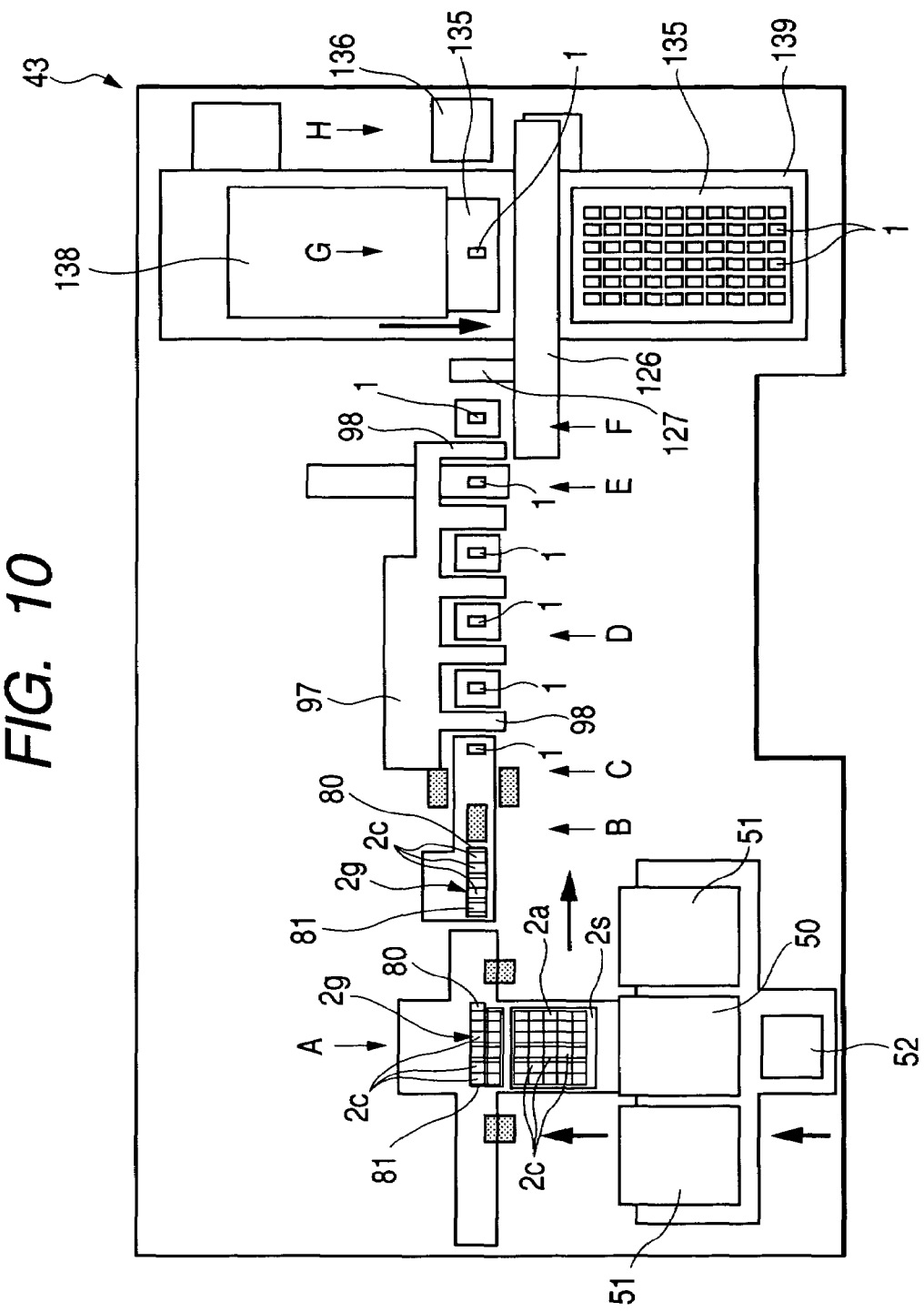
FIG. 10 is a typical plan view illustrating working stages and their related mechanisms of the semiconductor manufacturing apparatus.

FIG. 10 is a typical plan view showing respective working stages and their related mechanisms of the semiconductor manufacturing apparatus. In FIG. 10, a one-row dividing stage A, a fail mark detecting stage B, an individual division stage C, a thickness detecting stage D, a positioning stage E, a size detecting stage F, a non-defective product holding stage G and a defective product holding stage H are disposed. These stage portions are respectively configured of predetermined units.

At the one-row dividing stage A, a substrate (wiring board) 2a having a resin layer, in which product forming sections (areas) are disposed in matrix form, is pitch-fed sequentially and subjected to division for each row. Racks designated at numerals 51 and 51 are sequentially set to a substrate loader by manual. Substrates 2a placed in a stacked state, which are set to the substrate loader 50, are sequentially fed out to the one-row dividing stage A one by one by means of a substrate supply mechanism 52. Although not shown in the drawing, the substrate supply mechanism 52 takes a pusher configuration. The substrates 2a are fed out one by one by means of the pusher. Then, the substrates 2a are pitch-fed to the one-row dividing stage A by means of an unillustrated conveying mechanism. At the one-row dividing stage A, each substrate 2a is divided one row by one row so that slender strip bodies 2g are formed. The strip body 2g has a structure in which the product forming sections (areas) are arranged in a row therein.

Figure 1B:
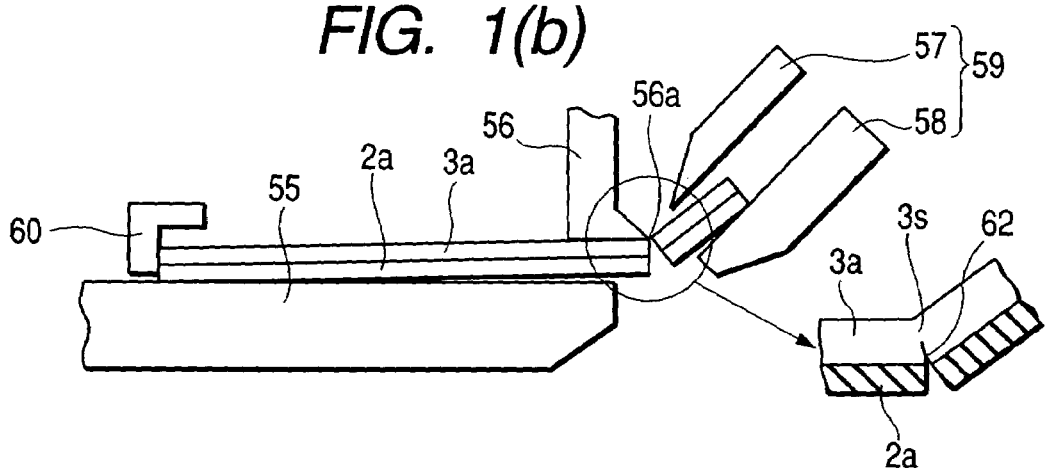

In the present embodiment, the two divisions of the primary dividing process (one-row division) for forming the strip body 2g, and the secondary dividing process (individual division) for dividing the strip body 2g at the boundaries among the respective areas (product forming sections) to provide fractionization thereof are performed in the case of the division of the substrate 2a. These divisions are performed by a division mechanism of such a mechanism as shown in FIGS. 1(a) and 1(b). Incidentally, even if one referred to above is called simply "substrate 2a" in the following description, it means the substrate 2a having the resin layer 3a in the description up to the individual division.

The division mechanism includes a base (conveying chute) 55 which places the substrate 2a (wiring board) over its upper surface such that the resin layer 3a serves as an upper surface, and a first device part (support body) 56 which faces the upper surface of the conveying chute 55 and faces the resin layer 3a of the substrate 2a placed over the conveying chute 55. A second device part (clamper) 59 is placed which is disposed in such a manner that an upper clamp claw 57 and a lower clamp claw 58 are positioned on the upper and lower surface sides of a protruded wiring board portion 2j of the substrate 2a, which is placed over the conveying chute 55 such that part thereof protrudes toward the division position side out of one edge (right edge in this figure) of the conveying chute 55. As shown in FIG. 1(a), the clamper 59 having such an attitude as to pinch the protruded wiring board portion 2j of the substrate 2a, comprising a flat plate placed over the conveying chute 5 in a flat state from the side in a state (non-contact state) in which it is not brought into contact with the substrate 2a and the resin layer 3a, is called "clamper" at the origin position. The clamper 59 at the origin position is set in such a manner that the upper clamp claw 57 and the lower clamp claw 58 are held in front of the protruded wiring board portion 2j with a clearance or gap ranging from about 0.2 to 0.3 mm being defined therebetween.

In the state in which the substrate 2a is being placed over the conveying chute 55, a gap of a predetermined size is defined between the resin layer 3a on the upper side of the substrate 2a and the lower surface of the support body 56. This aims to first bring the resin layer 3a placed over the upper surface of the substrate 2a into contact with the right edge of the support body 56 when the clamper 59 is turned upward to raise the protruded wiring board portion 2j with the lower clamp claw 58 and to divide the substrate 2a (and the resin layer 3a) at its contact portion. The portion where the resin layer 3a placed over the upper surface of the substrate 2a is first brought into contact with the support body 56, i.e., the right edge is called a fulcrum or support point 56a.

The lower surface of the support body 56 is made flat in such a manner that when the protruded wiring board portion 2j is forced up, the substrate 2a with the resin layer is first brought into contact with the fulcrum 56a. The gap between the resin layer 3a and the lower surface of the support body 56 is also set so as to range from about 0.2 to 0.3 mm.

With the rotation of the clamper 59 in the upward direction, the lower clamp claw 58 forces up the protruded wiring board portion 2j. Therefore, bending stress is exerted on the substrate 2a with the fulcrum 56a as the center so that division occurs in the substrate portion brought into contact with the fulcrum 56a. Thus, the positions of the fulcrum and a line segment extending downward from the fulcrum are called division positions.

In order to facilitate the division of the substrate 2a, grooves (division grooves) 2p are defined in the second surface (lower surface in FIG. 1) of the substrate 2a as shown in FIG. 1(a). The division grooves 2p are provided at predetermined intervals. Although a portion (line segment) on the right end side to be first divided is indicated by a thick line in FIG. 1(a), a groove (division groove) 2p is provided even on the lower surface side of the substrate 2a, which coincides with such a line segment. Each of the grooves 2p is formed as a groove having a V-shaped section such that the concentration of stress is easy to occur therein. In the drawings for subsequent description of division inclusive of FIG. 1, the division grooves 2p are shown only in FIG. 1(a) but they are omitted in FIG. 1(b) and subsequently.

A conveying claw 60 shown on the left side pitch-feeds the substrate 2a lying over the conveying chute 55. The portion to be first divided is aligned with its corresponding division position upon the first dividing operation. After this setting, each division groove 2p is always placed in its corresponding division position by pitch-feeding.

The clamper 59 can be rotated in upward and downward direction, respectively, from the state being placed in the origin position. As to the rotation of the clamper 59, the clamper 59 is configured so as to be capable of being rotated from the origin position with the fulcrum as the center to at least 80° to 120° in the upper direction and being rotated in the forward and reverse directions over at least about 10 to 45 degrees in the downward direction.

In such a division mechanism, as shown in FIG. 1(b), the clamper 59 placed in the origin position is rotated in the upward direction with the fulcrum 56a as the center to swing the protruded wiring board portion 2j upward and allow it to contact the fulcrum 56a provided at the support body 56, thereby dividing the substrate 2a (first division). However, in the rotation in such a one return direction, although described later, the surface layer portion of the resin layer 3a over the upper surface of the substrate 2a is not divided even if the substrate 2a formed of ceramic is divided, as indicated in an enlarged form on the right side of FIG. 1(b), so that a non-divided resin portion 3s occurs. That is, a division section (division line) 62 results in a state of stopping in the course of the resin layer 3a.

Figure 1C:
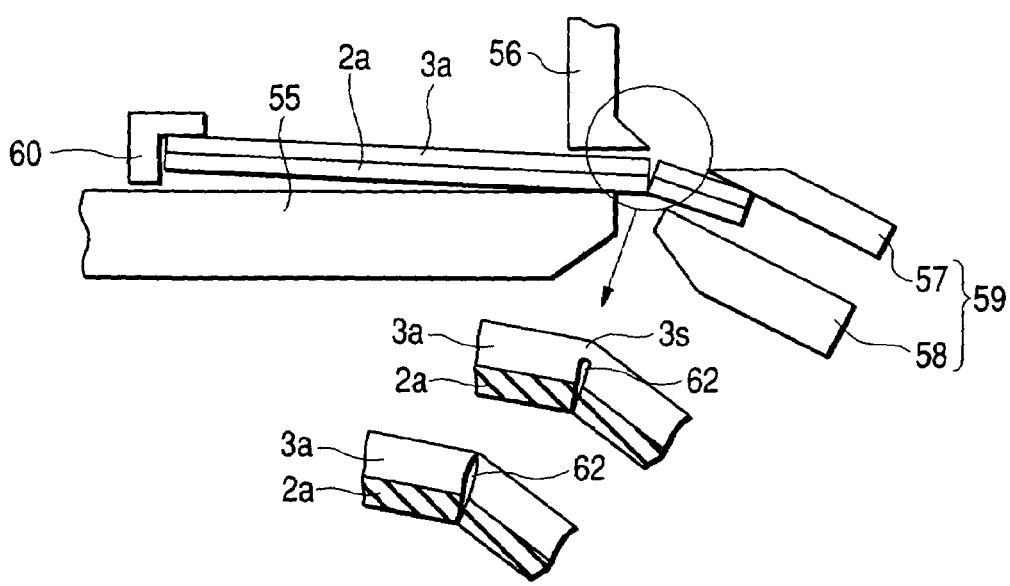

Thus, as shown in FIG. 1(c), the clamper 59 is rotated in the direction opposite to the direction of rotation at the first division to swing the protruded wiring board portion 2j below the upper surface of the conveying chute 55, thereby perfectly dividing the substrate 2a at the spot (division section 62) divided by the first division (second division). In the second division, as in the case of an upper drawing indicated in an enlarged form below FIG. 1(c), the end faces of the divided substrates constituted of ceramic firstly collide with each other and hence tensile stress acts on the non-divided resin portion 3s. As a result, the leading end of the division section (division line) 62 continues to extend to the non-divided resin portion 3s as indicated in an enlarged form below FIG. 1(c), whereby the non-divided resin portion 3s is also divided perfectly at the end. Incidentally, the turning angles or the like at the first division and the second division will be explained in the description of the one-row division mechanism.

The one-row division mechanism and the individual division mechanism are also basically configured such as shown in FIG. 1. However, the one-row division mechanism is different from the individual division mechanism in that, for example, since the former is wide in division width as compared with the latter, the conveying chute 55 and the support body 56 are made broadscale in structure, there is a need to cause the support body 56 to have rigidity since a large force is exerted on the support body 56, and a first division angle is made large. Incidentally, portions that perform the same action will be explained using the same names and the same reference numerals in the description of the one-row division mechanism and the individual division mechanism.

Figure 11:
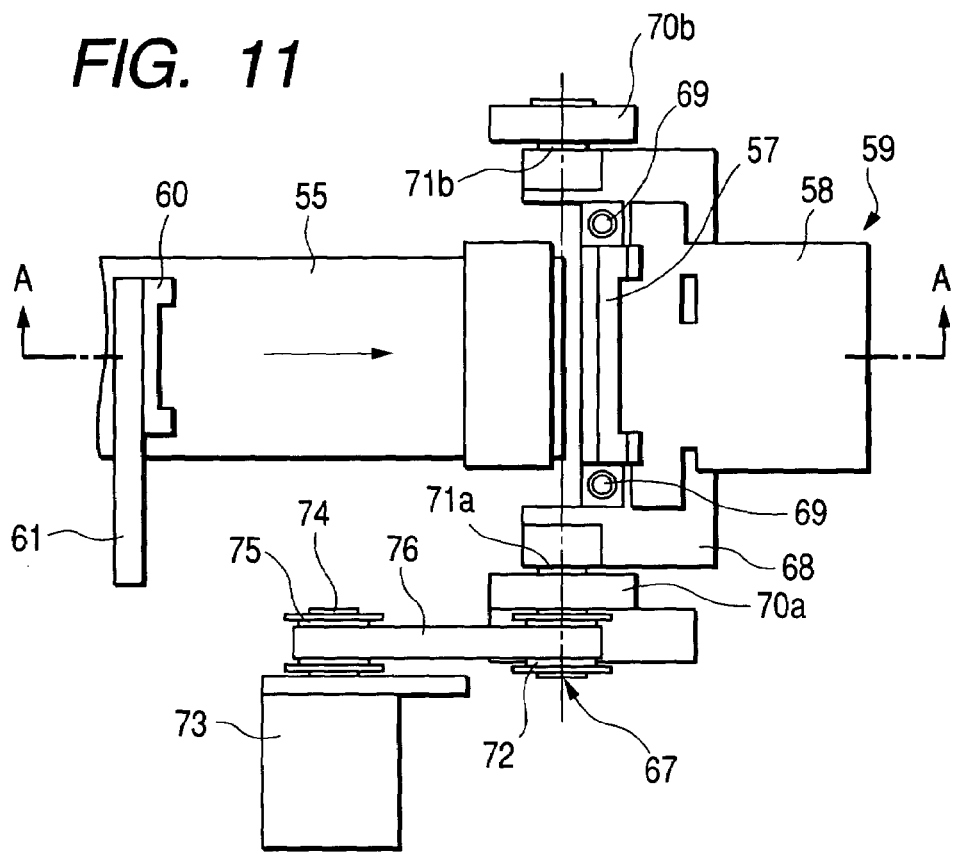
FIG. 11 is a typical plan view showing part of a one-row division mechanism of the semiconductor manufacturing apparatus.
Figure 12:
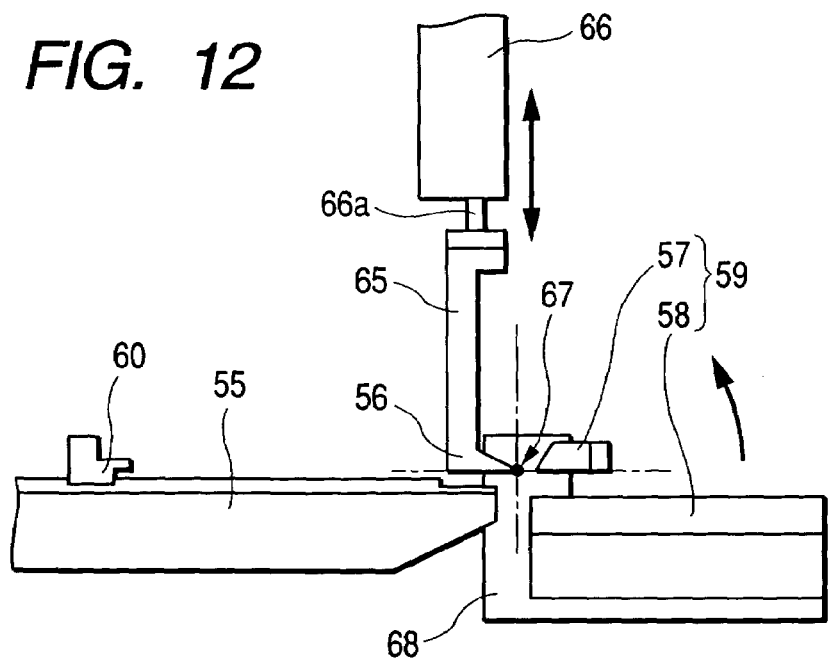
FIG. 12 is a typical cross-sectional view taken along line A—A of FIG. 11.

The respective portions will next be explained along the direction of an arrangement of the stages of the semiconductor manufacturing apparatus 43. As shown in FIGS. 11 and 12, the conveying chute 55 for placing each substrate 2a over its upper surface is disposed at the section of the one-row division stage A. A sheet of substrate 2a is delivered to the conveying chute 55 by the substrate loader 50. The substrate 2a is pitch-fed to the right side by a conveying claw 60 in FIGS. 11 and 12. The conveying claw 60 is supported by a support arm 61. The support arm 61 is attached to an unillustrated drive unit and performs pitch-feeding and a tact operation to transfer the substrate 2a to its corresponding division position sequentially. A support body 56 is located above the right end of the conveying chute 55. The support body 56 comprises a lower section having a fulcrum or support point 56a, and a plate-shaped section 65 connected to the lower section. A rod 66b of a vertically movable cylinder 66 is fixed to the upper end of the plate-shaped section 65 and serves so as to move the support body 56 upward and downward by the vertical movements of the rod 66b. When the substrate 2a is placed over the conveying chute 55, the support body 56 is raised.

The clamper 59 referred to above is disposed over the extension of the right end of the conveying chute 55. A lower clamp claw 58 is fixed to a support block 68 rotated vertically about the center of rotation 67 (see FIG. 11). Also, an upper clamp claw 57 has bot ends fixed with bolts 69. Both ends of the support block 68 are fixed to their corresponding rotatable shafts 71a and 71b, which are respectively supported by support members 70a and 70b. One end of one rotatable shaft 71a is fixed to the support block 68, and a driven pulley 72 is fixed to the other end thereof. Also the other rotatable shaft 71b is rotatably supported by the support member 70b via a bearing.

The driven pulley 72 is mounted on a drive belt 76 mounted on a drive pulley 75 fixed to a rotatable shaft 74 of a division swing motor 73. Thus, the rotatable shaft 71 is rotated in the forward and reverse directions under forward/reverse rotational drive of the one-row division swing motor 73. As a result, the clamper 59 is rotated vertically. As shown in FIG. 12, the center of rotation 67 is set to the position where it coincides with the fulcrum 56a of the support body 56.

Figure 19:
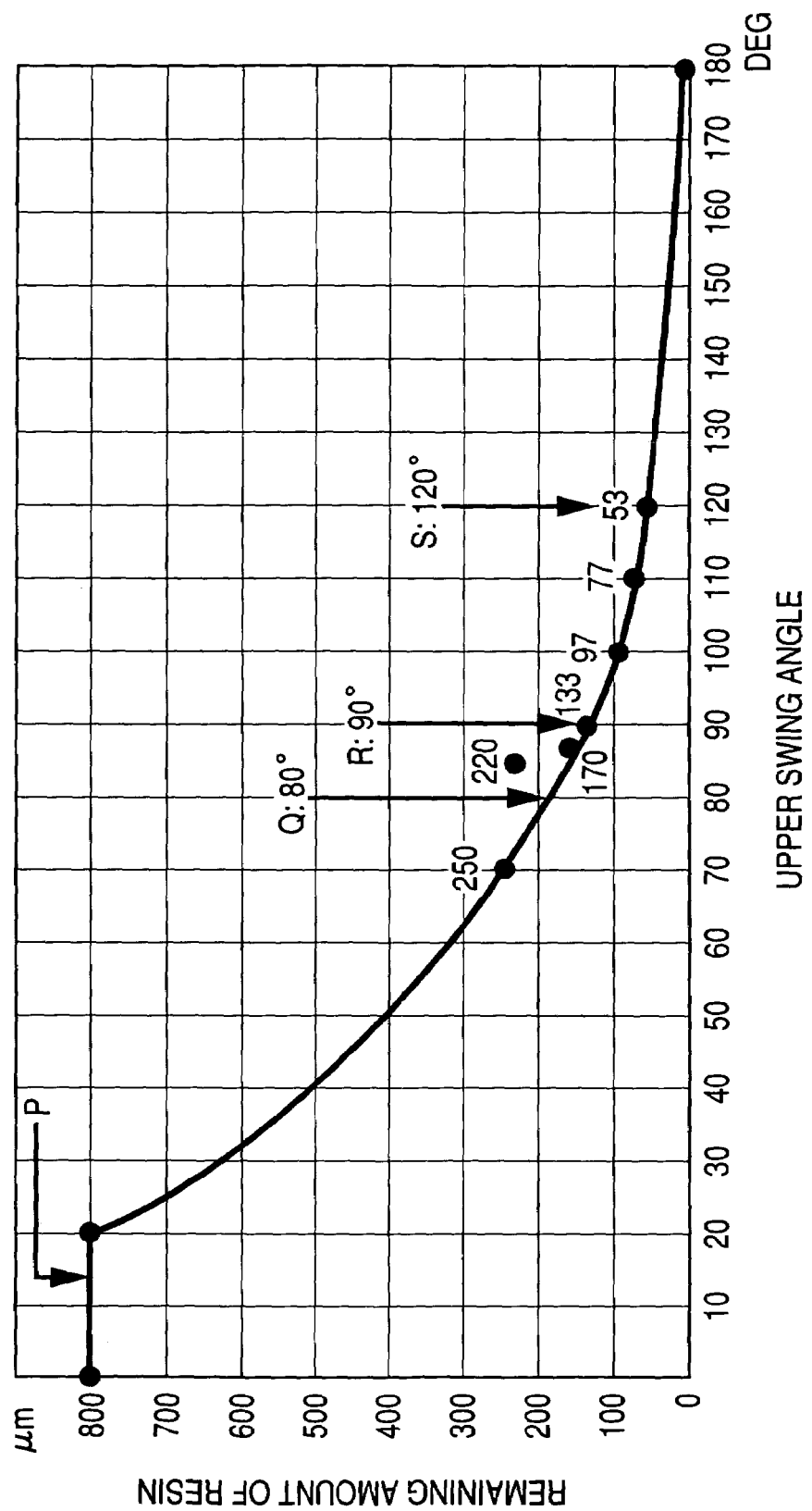
FIG. 19 is a graph showing a correlation between upper swing angles at one-row division with respect to a silicone resin and the remaining amount of resin (thickness of non-divided resin portion) that covers the substrate.
Figure 20:
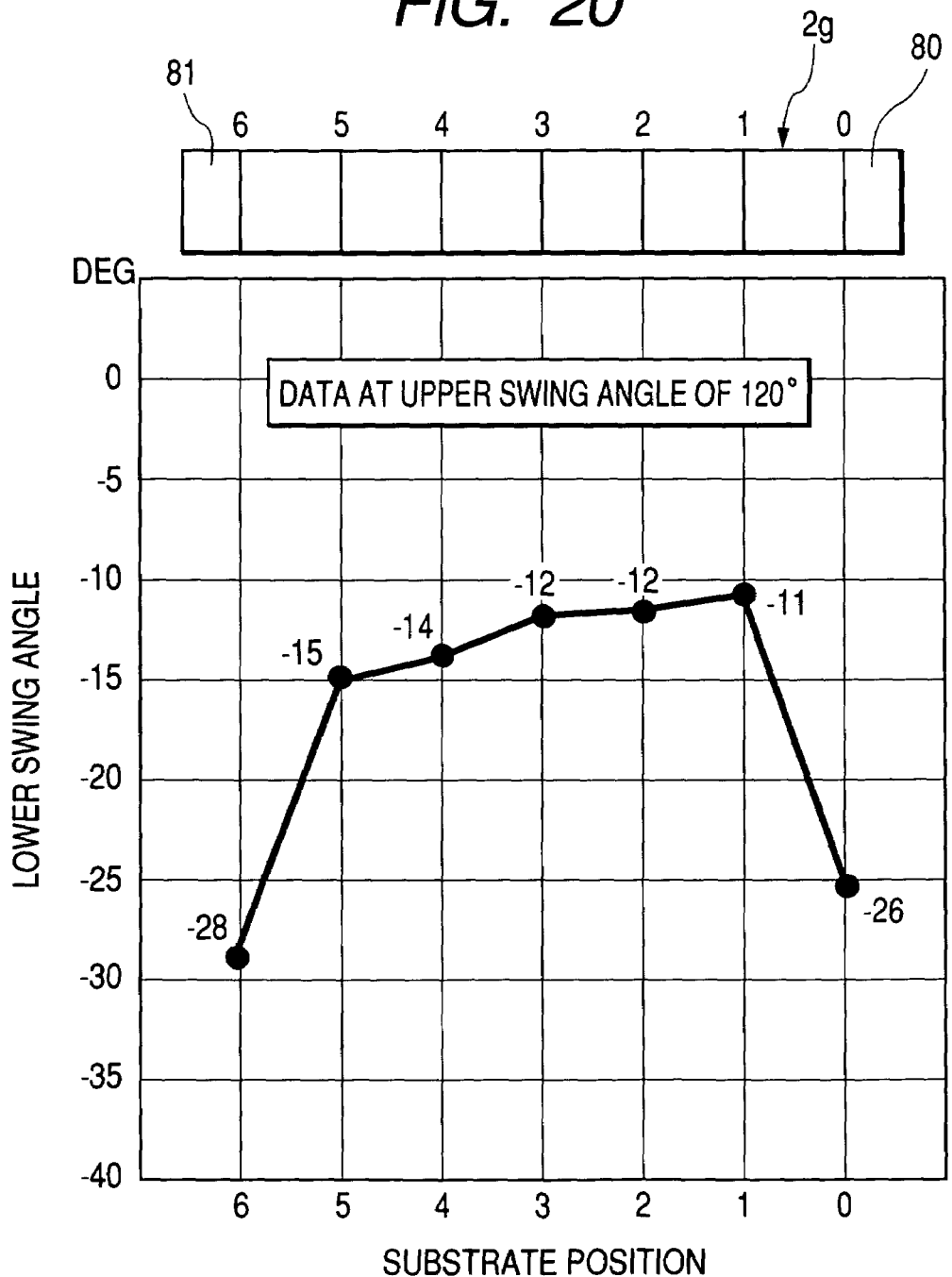
FIG. 20 is a graph illustrating a correlation between substrate division positions at the individual division and cutting angles (lower swing angles) at their positions.

A description will now be made of the rotating angles of upper and lower swings of the clamper in the one-row division mechanism and the individual division mechanism. FIGS. 19 and 20 show data obtained by experiments and analyses made by the present inventors. FIG. 19 is a graph showing a correlation between upper swing angles at one-row division of the substrate and the remaining amount of resin (the thickness of the non-divided resin portion) that covers the substrate. When the thickness of the resin layer 3a is set as 800 μm, for example, the substrate 2a formed of ceramic is divided at about an upper swing angle of about 20° (see a point P indicated in the same graph), as is understood from the graph of FIG. 19. When the upper swing angle is 70°, the thickness of the non-divided resin portion (remaining amount of resin) results in about 250 μm. When the upper swing angle is 80°, the remaining amount of resin (thickness) becomes approximately 220 μm. It is understood that when the upper swing angle is made large sequentially, the remaining amount of resin becomes thin sequentially. Although most ones are perfectly divided if the upper swing angle is set to 180°, the adoption of the upper swing angle of 180° is difficult from the relationship of layouts among the respective mechanism portions.

Thus, checks were made, at the division of the strip body 2g, as to when the perfect division at the second division has occurred where the upper swing angle was set to 120°. FIG. 20 is a graph showing a correlation between substrate division positions at the substrate individual division and cutting angles (lower swing angles) at their positions.

The substrate 2a in which the areas (product forming sections) are disposed rectangularly in matrix form, has a non-used frame portion 2s that exists around the areas (product forming sections) 2c arranged in matrix form in consideration of product reliability as shown in FIG. 10.

Figure 33A:
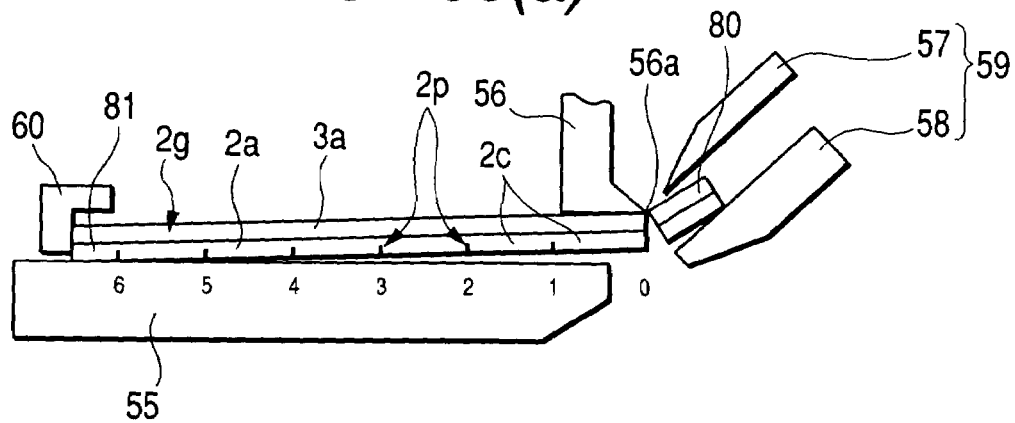
FIGS. 33(a) to 33(c) are typical views showing a state of division of a strip body at each substrate position.
Figure 33B:
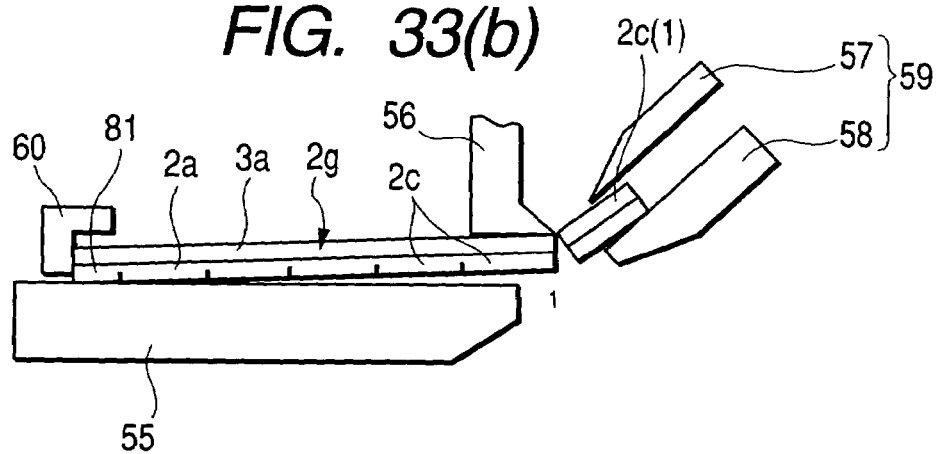
Figure 33C:
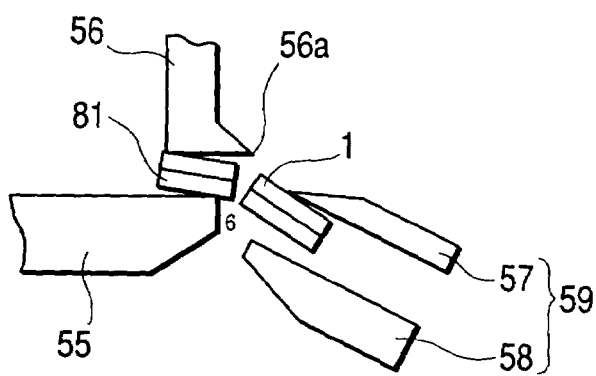
Figure 34:
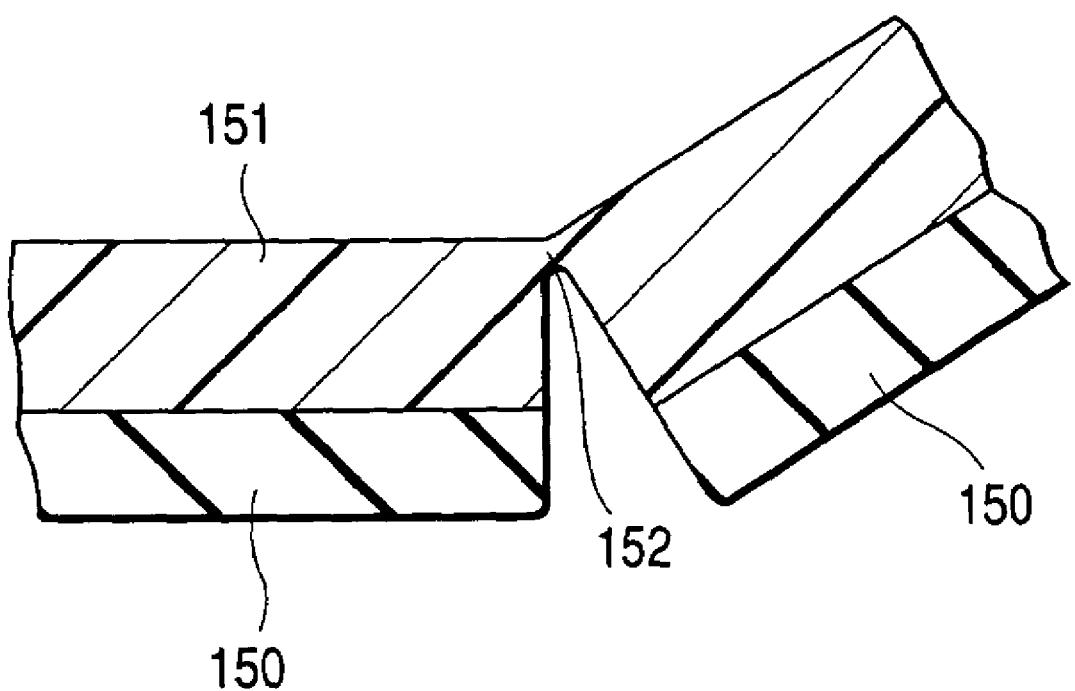
FIG. 34 is a typical view illustrating a divided state of a substrate covered with a conventional silicone resin.

Thus, when the primary dividing process is done to form a strip body 2g, a frame portion 80, which protrudes toward the clamper 59 side upon the first division, exists in the form in which divisions are sequentially made at seven spots of numbers 0 to 6 corresponding to substrate positions as shown in FIG. 20. FIGS. 33(a) to 33(c) show the divisions (division positions 0, 1 and 6) at the respective substrate positions. Incidentally, division processing will now be explained under the configuration of FIG. 1. FIG. 33(a) shows a state in which the frame portion 80 is forced up by the clamper 59 and thereby divided at the division position 0. FIG. 33(b) shows a state in which the first area (product forming section) 2c is swung upward at the division position 1 to achieve its division. FIG. 33(c) shows a state in which the final area (product forming section) 2c is swung downward to divide it from a frame portion 81 (at the division position 6). The frame portion 81 is placed over the conveying chute 55. Owing to the existence of these frame portions 80 and 81 short in length, the strip body is perfectly divided at a lower swing angle of 26° downwardly from the state in which the clamper is placed in the origin position, in the case of the first division. In the case of the final division, it is perfectly divided at a lower swing angle of 28°. The angles are marked with minus (−) here since the clamper placed in the origin position is swung downward. It is understood that the strip body can be perfectly divided in a lower swing angular range of −11° to −15° in the case of the respective divisions at the substrate positions of 1 to 5. These data correspond to the case in which the resin layer 3a is formed of a silicone resin.

According to the result of other experiments made by the present inventors, it was understood that when the upper swing angle was 80° and 90° under the condition in which the length of one row was set to about 75 mm, the substrate could be divided at lower swing angles of approximately, 40° and 35° respectively.

From the above result of experiments, the present inventors have found out that when the upper swing angle is increased upon division of the substrate, the lower swing angle can be made small, whereas when the upper swing angle is made small in reverse, there is a need to increase the lower swing angle.

The first embodiment shows the example in which in the case of the first division at each of the one-row division and the individual division, the clamper 59 placed in the origin position is rotated to the upper swing angle of 90°, and in the case of the subsequent second division, the clamper 59 is rotated in the reverse direction and turned up to an angular position of 20° downwardly from the origin position. If the remaining amount of resin (thickness) is set to 0.1 mm or less at the first division here, then the substrate can be divided at a small angle and reliably upon the second division.

Figure 21:
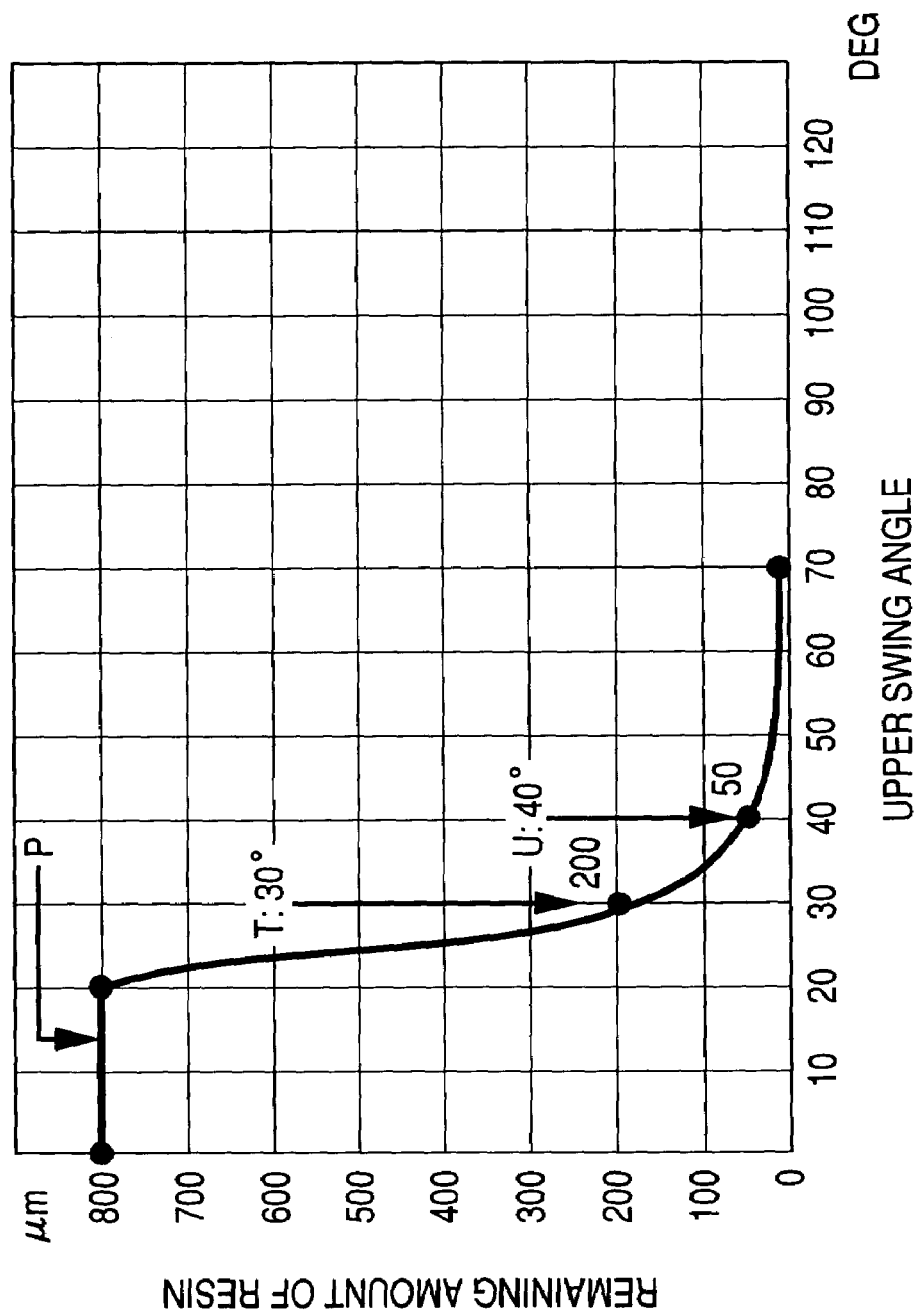
FIG. 21 is a graph showing a correlation between upper swing angles at one-row division with respect to a low elastic epoxy resin and the remaining amount of resin (thickness of non-divided resin portion) that covers the substrate.
Figure 22A:
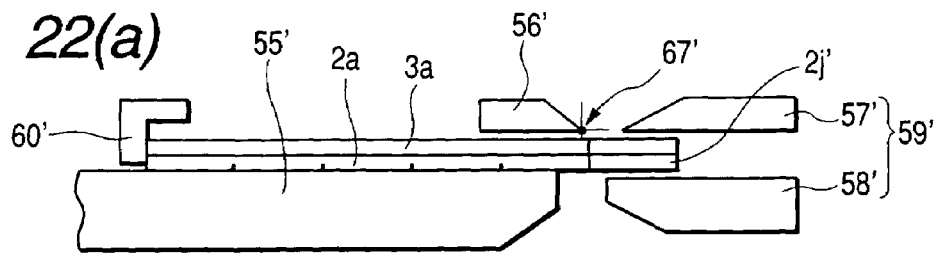
FIGS. 22(a) to 22(d) are typical views illustrating respective operation stages of the individual dividing mechanism.
Figure 22B:
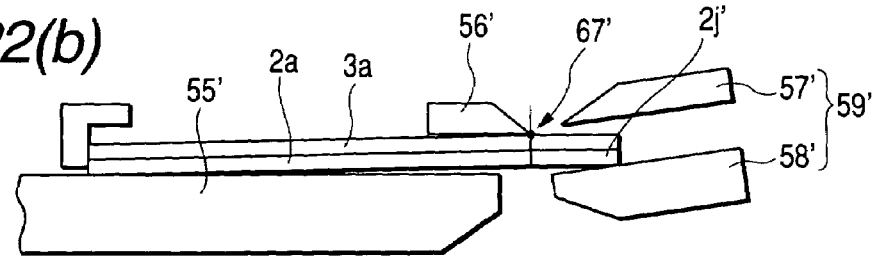
Figure 22C:
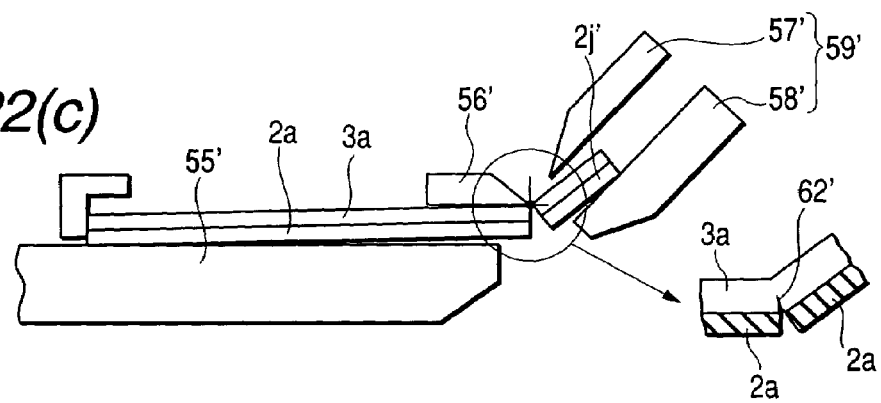
Figure 22D:
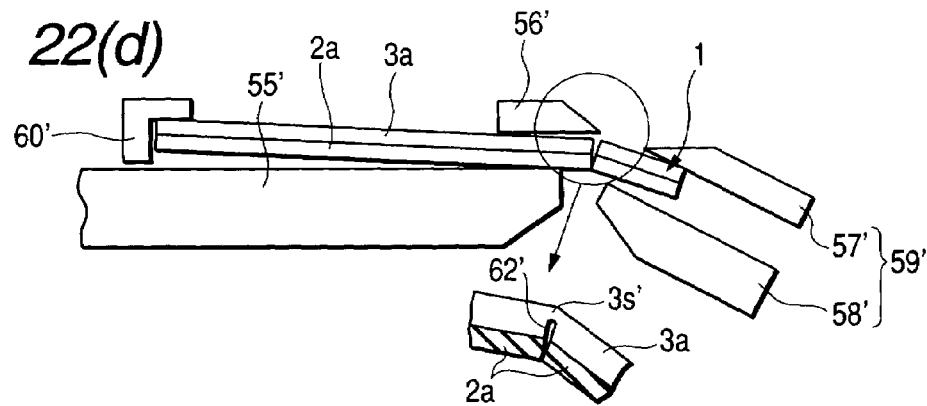

A description will now be made of a case in which the resin layer 3a is formed of a low elastic epoxy resin. FIG. 21 is a graph showing a correlation between upper swing angles at the division of a substrate in which a resin layer is formed of an epoxy resin having a low elastic modulus and the remaining amount of resin (thickness of non-divided resin portion) that covers the substrate.

According to the result of other experiments made by the present inventors, it was understood that when the upper swing angle was 30° and 40° under the condition in which the length of one row was set to about 75 mm, the substrate could be divided at a lower swing angle of approximately, 30°.

From the above result of experiments, the present inventors have found out that when the upper swing angle is increased upon division of the substrate, the lower swing angle can be made small, whereas when the upper swing angle is made small in reverse, there is a need to increase the lower swing angle.

When the resin layer 3a is formed of the low elastic epoxy resin, the clamper 59 placed in the origin position is rotated up to an upper swing angle of 40° in the first division at each of the one-row division and the individual division, and the clamper 59 is rotated in the reverse direction in the subsequent second division to turn up to an angular position of 30° downwardly from the origin position. Thus, the perfect division can be performed.

Figure 13A:
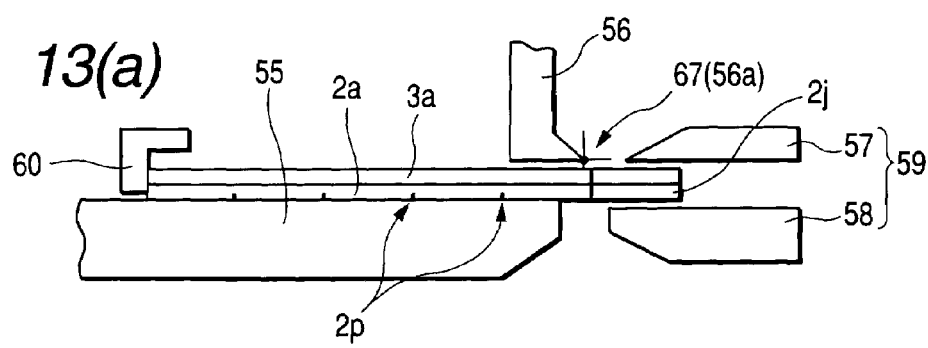
FIGS. 13(a) to 13(d) are typical views showing respective operation stages of the one-row division mechanism.

FIGS. 13(a) through 13(d) show a method of forming a strip body 2g by the first division and the second division at the one-row division mechanism. As shown in FIG. 13(a), a substrate 2a is positioned and placed over the upper surface of the conveying chute 55.

Figure 13B:
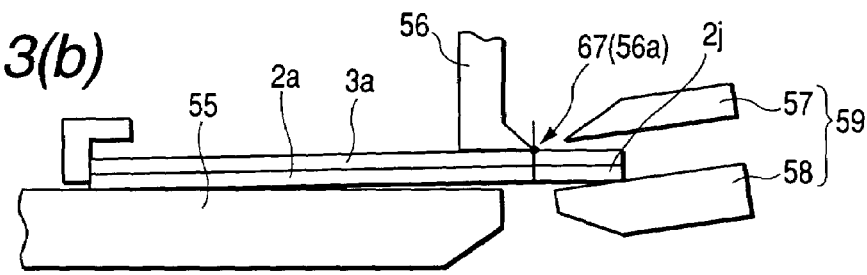
Figure 13C:
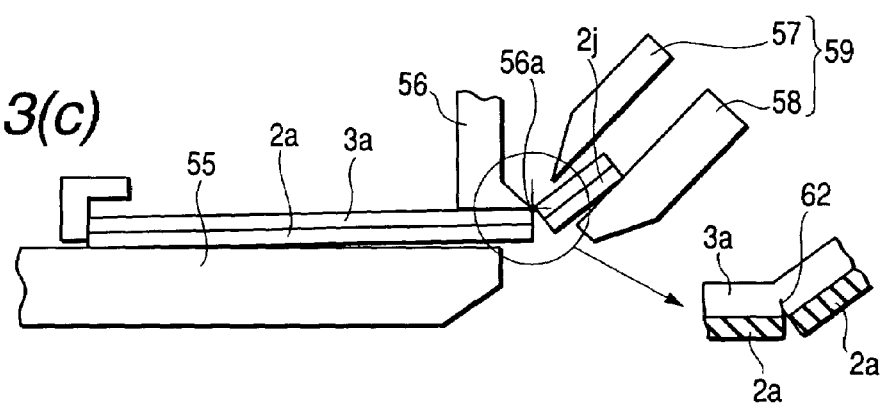

Next, as shown in FIG. 13(b), the clamper 59 is rotated by 90° (forward-rotated) upward about the fulcrum 56a to perform the first division. With its rotation, a protruded wiring board portion 2j that protrudes from one edge (right edge) of the conveying chute 55 is forced up by the lower clamp claw 58 so that the portion to be divided is brought into contact with the fulcrum 56a of the support body 56. As shown in FIG. 13(c), the clamper 59 is further raised so that bending stress is applied to the protruded wiring board portion 2j about the fulcrum 56a. Thus, the substrate 2a is perfectly divided as described above and a division section 62 cuts into a resin layer 3a. At this time, however, a non-divided resin portion 3s remains in the resin layer 3a as described above and hence the substrate 2a is brought to a perfectly non-divided state. Incidentally, the center of rotation 67 is indicated by a black circle in FIGS. 13(a) to 13(d). The center of rotation 67 overlaps the fulcrum 56a.

Figure 13D:
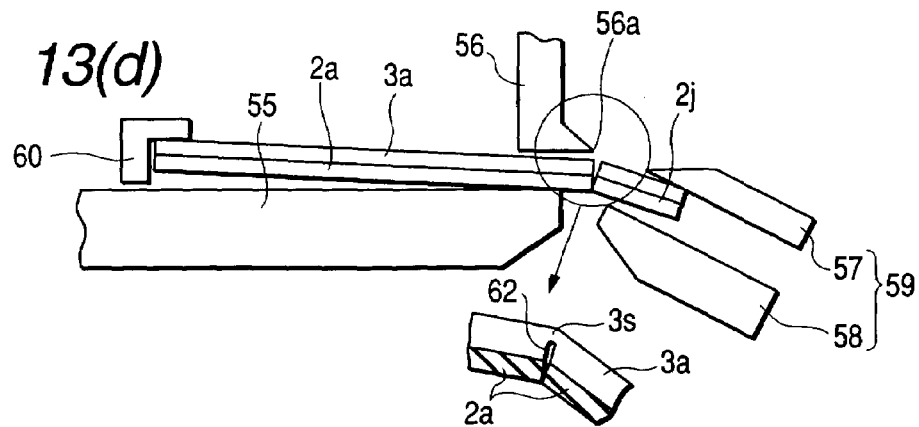

Next, as shown in FIG. 13(d), the clamper 59 is rotated in the reverse direction to allow the upper clamp claw 57 to push down the protruded wiring board portion 2j to perform the second division. The clamper 59 is rotated and moved downward at an angle of about 35° about the fulcrum 56a from the origin position thereof. That is, the clamper 59 is rotated by 90° from the origin position by the forward rotation and thereafter reversely rotated by 125°. As a result, the substrate 2a is brought to a state being held by the right edge of the conveying chute 55 and the conveying claw 60 or the support body 56. Then, the clamper 59 is further rotated in the reverse direction so that tensile stress is applied to the non-divided resin portion 3s as shown in the lower right enlarged drawing of FIG. 13(d). That is, the end faces of the divided substrates 2a constituted of ceramic firstly collide with each other due to bending and hence tensile stress acts on the non-divided resin portion 3s. Thus, the leading end of a division section (division line) 62 continues to extend to the non-divided resin portion 3s, whereby the non-divided resin portion 3s is also divided perfectly at the end. This occurs instantaneously. Thus, the strip body 2g is formed as shown in FIG. 10. The strip body 2g results in such a structure that the areas (product forming sections) are arranged in a row.

Figure 14:
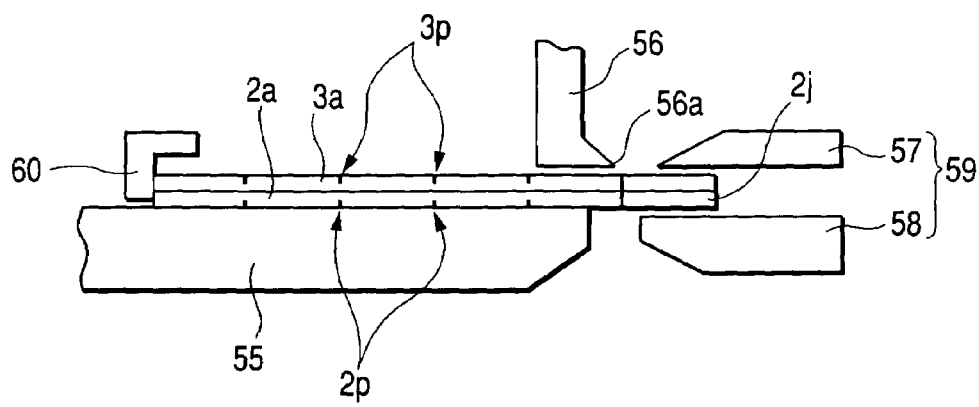
FIG. 14 is a typical view depicting substrate division illustrative of a modification of the first embodiment.

FIG. 14 is a typical view showing a substrate one-row division illustrative of a modification of the first embodiment. In FIG. 14, grooves (division grooves) 3p are defined even in the surface of a resin layer 3a in association with the division grooves 2p to make it easy to perform the division, thereby making it easier to carry out the division. Forming the division grooves 3p in the surface of the resin layer 3a in this way makes it possible to accurately determine each division position (division line) in cooperation with the existence of the division grooves 2p and make constant the size of a finally formed semiconductor device 1.

Figure 15:
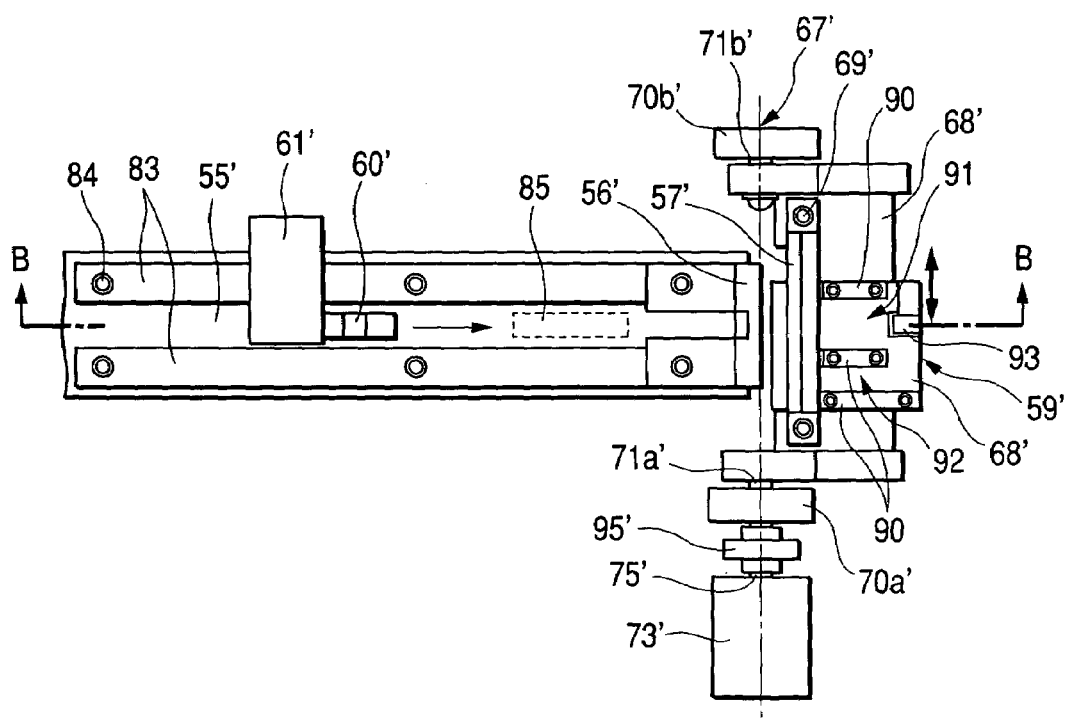
FIG. 15 is a typical plan view showing an individual dividing mechanism for individually dividing a substrate, of the semiconductor manufacturing apparatus.
Figure 16:
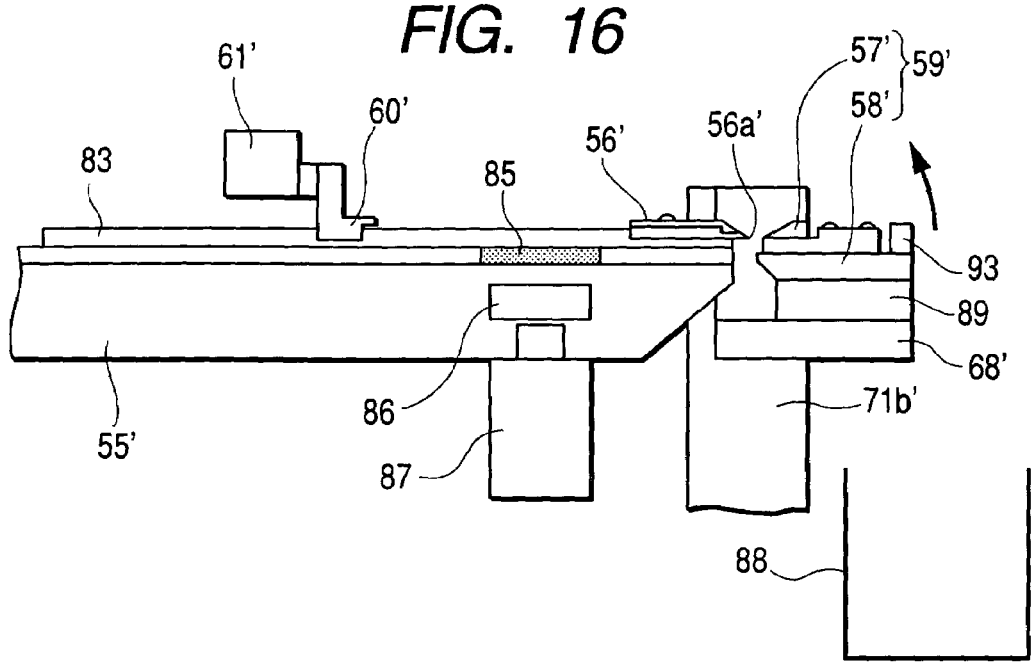
FIG. 16 is a typical cross-sectional view taken along line B—B of FIG. 15.

The fail mark detecting stage B and the individual division stage C will next be described with reference to FIGS. 15 through 18 and FIGS. 22(a) to 22(d). The strip body 2g formed by one-row division in the one-row dividing stage A is conveyed onto the conveying chute 55 in which the fail mark detecting stage B and the individual division stage C exist, by means of an unillustrated conveying mechanism. The conveying mechanism serves as, for example, a motor-driven conveyance claw-feeding mechanism often used in general. A mechanism including the conveying chute 55, a support body 56 having a fulcrum 56a placed over the right edge of the conveying chute 55, and a clamper 59 disposed on the extension side of the right edge of the conveying chute 55 is shown in FIGS. 15 and 16. Since the individual division mechanism is similar in structure to the one-row division mechanism, similar component parts use the same names as those of the one-row division mechanism, and reference numerals will be explained with being marked with dashes or apostrophes ('). In particular, the description of the component parts identical in configuration and operation to the one-row division mechanism will be omitted.

Figure 17:
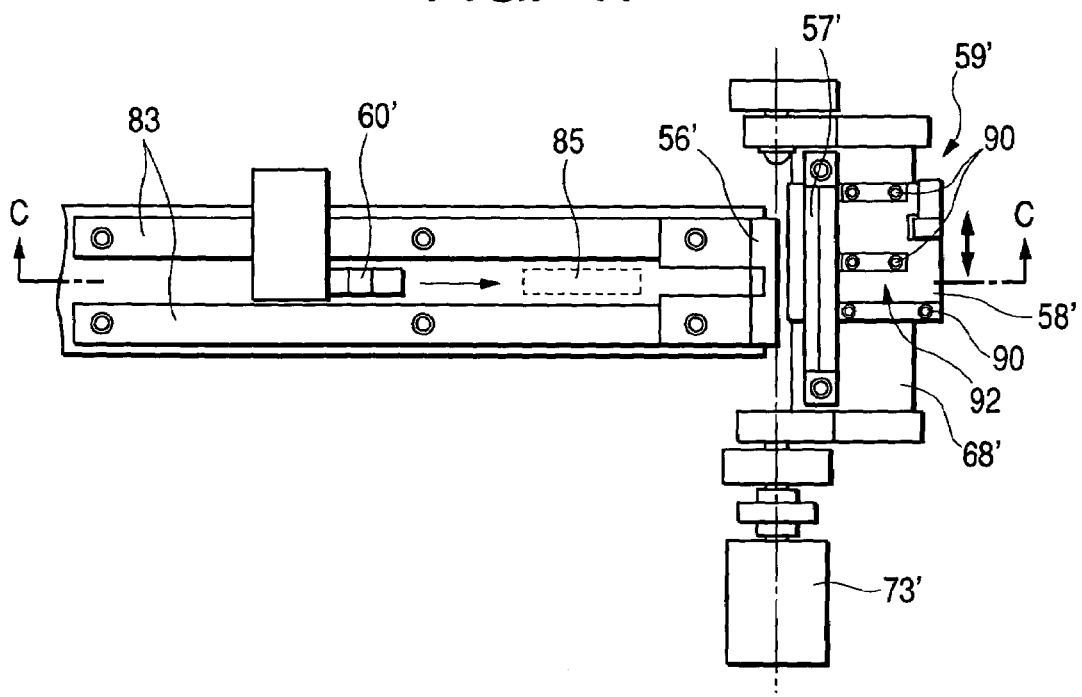
FIG. 17 is a typical plan view depicting a slide manner for eliminating a defective product in the individual dividing mechanism.
Figure 18:
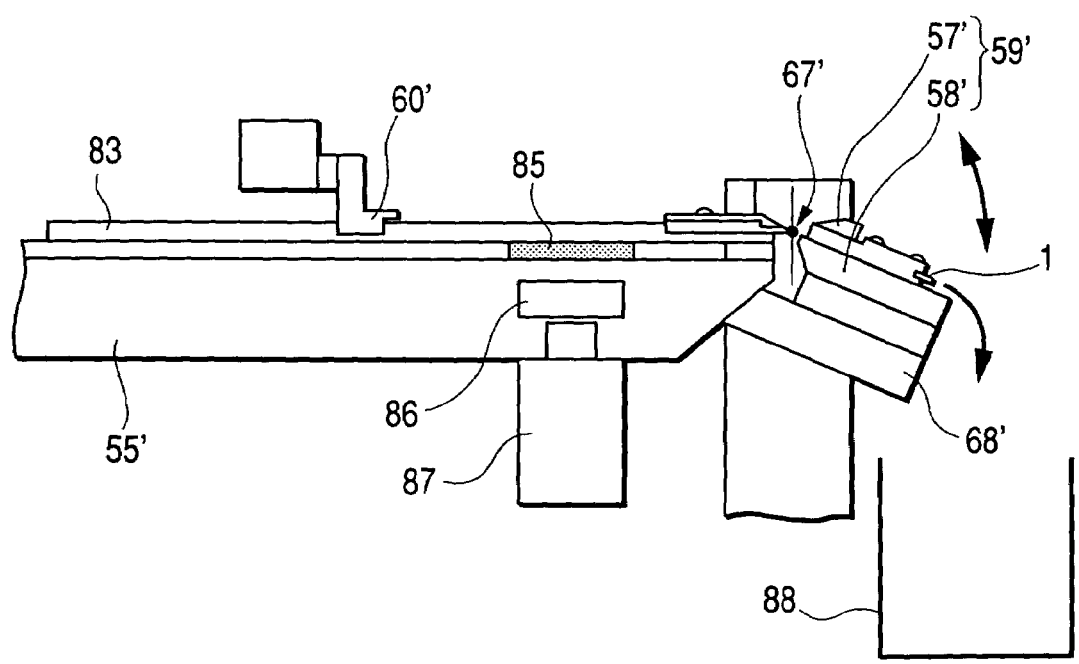
FIG. 18 is a typical cross-sectional view taken along line C—C of FIG. 17.

The conveying chute 55 of the individual division mechanism is provided with a fail mark detection mechanism for detecting the presence or absence of a fail mark on the lower surface of the strip body 2g. The clamper 59 of the individual division mechanism is provided with a structure having a selection mechanism for eliminating a product (semiconductor device) with a fail mark upon individual division. The clamper 59 takes such a configuration (slide configuration) that the clamper 59 is slid to the side and switched when it receives the semiconductor device with the fail mark. FIGS. 15 and 16 are drawings illustrative of such an attitude that the clamper receives a semiconductor device with no fail mark. FIGS. 17 and 18 are drawings illustrative of such an attitude tat the clamper receives a semiconductor device provided with a fail mark and causes it to pass to thereby allow a defective product storage box 88 to hold the corresponding defective semiconductor device.

As shown in FIG. 15, a clamper 59' having an upper clamp claw 57' and a lower clamp claw 58' is located on the extension side of the right end of a conveying chute 55' extending in the horizontal direction. As shown in FIG. 16, a support body 56' is disposed slightly above the right end of the conveying chute 55'.

In order to cause the conveying chute 55' to guide a slender strip body 2g, a pair of guide pieces 83 is disposed over the upper surface of the conveying chute 55' so as to have an interval therebetween, which allows one strip body 2g to pass and guide. The guide pieces 83 are fixed to the conveying chute 55' with bolts 84.

Part of the conveying chute 55' through which the strip body 2g passes, takes a structure which is formed in a transparent body 85 and detects whether a fail mark exists in each of areas (product forming sections) of the strip body 2g, by a fail mark detection mechanism disposed below the conveying chute 55'. The fail mark detection mechanism comprises a projector 86 which applies light onto the transparent body 85, and a monitor camera 87 which detects the lower surface of the strip body 2g. Information of the fail mark detection mechanism is transmitted to a control system where it is processed. A selection mechanism is operated based on this information to allow a defective product to drop and put in the defective product storage box 88 located below the clamper 59' as shown in FIG. 18.

The support body 56' of the individual division mechanism is small in division force as compared with the support body 56 of the one-row division mechanism. Thus, the rigidity of the support body 56' may be smaller than that of one employed in the one-row division mechanism. The support body 56' can be configured as a structure which is as thin as approximately 3.5 mm, for example. The support body 56' has the advantage that a spatial region above the support body 56' can be used effectively. Both ends of the support body 56' are respectively fixed to the guide pieces 83 with bolts 84. The support body 56' may be a single-sheet structure or a double-sheet structure or the like.

A support block 68' controlled so as to rotate forward and backward by a division swing motor 73' slidably controls the lower clamp claw 58' in the direction (transverse direction) normal to the direction of conveyance of the strip body 2g. The lower clamp claw 58' is fixed onto a slide section 89, and the slide section 89 slides on the support block 68'. A slide mechanism is omitted. The individual division mechanism is configured so as to directly connect a drive pulley 75' of the division swing motor 73' to a rotatable shaft 71a' by a coupling 95' to rotate the support block 68' forward and backward.

Three slender guide pieces 90 are fixed to the lower clamp claw 58' with screws. For example, a defective product chute 92 is formed of the central guide piece 90 and the guide piece 90 provided on the right side as viewed in the travelling direction of the strip body 2g. The state of FIG. 15 shows the manner in which a non-defective product chute 91 is capable of receiving each non-defective product. The non-defective product chute 91 is provided with a stopper 93, which is positioned onto the non-defective product chute 91 so as to receive a semiconductor device 1 slid within the inclined non-defective product chute 91.

Under the attitude that each defective product is accepted, the lower clamp claw 58' is slid toward the left side as viewed in the travelling direction of the strip body 2g. Thus, the defective product chute 92 receives divided and fractionalized semiconductor devices 1 as shown in FIG. 17. The defective product chute 92 is provided with no stopper. Thus, the semiconductor devices 1, which drop with being slid on the inclined non-defective chute 92, are accommodated in the defective product storage box 88 as shown in FIG. 18.

As shown in FIG. 15, the upper clamp claw 57' extends longer than the lower clamp claw 58' in such a manner that the upper clamp claw 57' always faces the sliding lower clamp claw 58', and has both ends fixed to the support block 68' with screws.

FIG. 15 shows the attitude of the clamper 59' which accepts each non-defective product, and FIG. 16 shows the state of the clamper 59' returned to its origin position before the starting of the individual division or after its completion. FIG. 17 shows the attitude of the clamper 59' which accepts or takes up each defective product, and FIG. 18 shows the state of the clamper 59' which performs the individual division and is held in an inclined state.

FIGS. 22(*a*) through 22(*d*) show fractionalization by the first division and the second division in the individual division mechanism, i.e., a method of forming each semiconductor device 1. As shown in FIG. 22(*a*), a strip body 2g is positioned and placed over the upper surface of its corresponding conveying chute 55'.

Next, as shown in FIG. 22(*b*), the clamper 59' is rotated by about 120° (forward-rotated) upward about the fulcrum 56a' to perform the first division. With its rotation, a protruded wiring board portion 2j' that protrudes from one edge (right edge) of the conveying chute 551 is forced up by its corresponding lower clamp claw 58' so that the portion to be divided is brought into contact with the fulcrum 56a' of the support body 56'. As shown in FIG. 22(*c*), the clamper 59' is further elevated so that bending stress is applied to the protruded wiring board portion 2j' about the fulcrum 56a'. Thus, the strip body 2g is perfectly divided as described above and a division section 62' cuts into a resin layer 3a. At this time, however, a non-divided resin portion 3s' remains in the resin layer 3a as described above and hence the strip body 2g is brought to a perfectly non-divided state. Incidentally, the center of rotation 67' is indicated by a black circle in FIGS. 22(*a*) to 22(*d*). The center of rotation 67' overlaps the fulcrum 56a'.

Next, as shown in FIG. 22(*d*), the clamper 59' is rotated in the reverse direction to allow the upper clamp claw 57' to push down the protruded wiring board portion 2j' to perform the second division. The clamper 59' is rotated and moved downward at an angle of about 30° about the fulcrum 56a' from its origin position. That is, the clamper 59' is rotated by 120° from the origin position by the forward rotation and thereafter reversely rotated by approximately 150°. As a result, the strip body 2g is brought to a state being held by the right edge of the conveying chute 55' and the corresponding conveying claw 60' or support body 56'. Then, the clamper 59' is further rotated in the reverse direction so that tensile stress is applied to the non-divided resin portion 3s' as shown in the lower right enlarged drawing of FIG. 22(*d*). That is, the end faces of the divided substrates 2a constituted of ceramic firstly collide with each other due to bending and hence tensile stress acts on the non-divided resin portion 3s'. Thus, the leading end of a division section (division line) 62' continues to extend to the non-divided resin portion 3s', whereby the non-divided resin portion 3s' is also divided perfectly at last. The extension of the division section (division line) 62' occurs instantaneously. Thus, each substrate 2a results in a module substrate 2 by the individual division, and resin layer 3a results in an encapsulating body 3.

The slide position of the lower clamp claw 58' is controlled based on the information of the fail mark detection mechanism. Thus, each semiconductor device 1 taken as non-defective is placed over the non-defective product chute 91 of the lower clamp claw 58', whereas each semiconductor device 1 regarded as defective is recovered into the defective product storage box 88.

Although only the lower clamp claw 58 has such a structure as to slide laterally upon elimination of each product with the fail mark in the present embodiment, both the upper clamp claw 57 and the lower clamp claw 58 may take such a structure as to slide laterally.

The semiconductor devices 1 placed in the individual division stage C are sequentially pick-up conveyed onto subsequent plural stages by an individual conveying mechanism 97. In FIG. 10, the individual conveying mechanism 97 is configured so as to cause five arms 98 to extend on the stages, adsorb and hold the semiconductor devices 1 under vacuum by vacuum adsorption tools attached to portions below their leading ends although not shown in the drawing and convey the same to the next stage.

Figure 23:
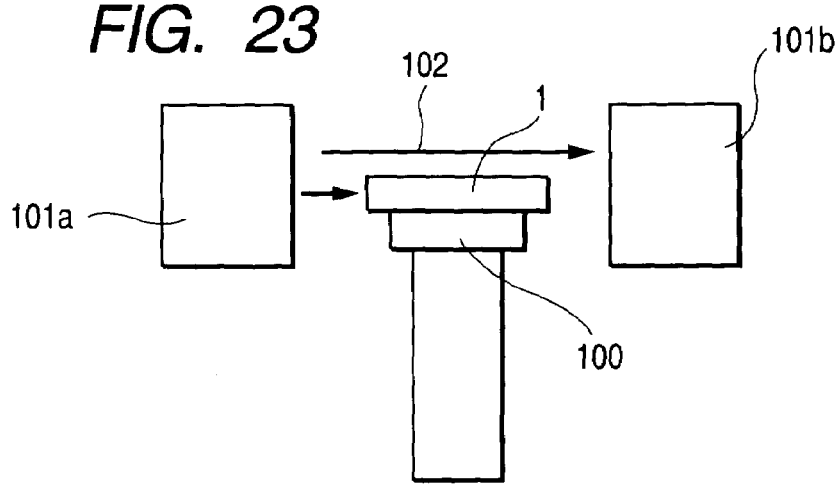
FIG. 23 is a typical side view schematically showing a thickness inspection mechanism of a thickness inspection stage of the semiconductor manufacturing apparatus.

A thickness detection mechanism is disposed in the thickness detecting stage D. As shown in FIG. 23, a laser sensor 101a and a photoreceptor 101b are placed at the side face of a stage 100 of the thickness detecting stage D. The thickness of the semiconductor device 1 placed over the stage 100 is measured according to the irradiation of laser light 102 and the amount of light reception. Such measured information is transmitted to a control system where it is processed. A computing process related to it is performed by the control system to make a decision as to a non-defective/defective product. This information is stored. The final stage is provided with a pickup mechanism which picks up semiconductor devices 1 and which conveys a non-defective product to a non-detective product storage unit and conveys a defective product to a defective product storage unit. The thickness detection information is also equivalent to one information which determines by the pickup mechanism whether each product is good or bad. If the product is determined as defective, then even ones judged to be non-detective by other detection information are conveyed to a defective product storage unit.

Figure 24:
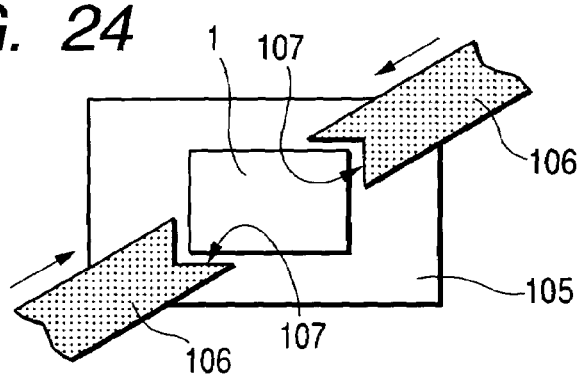
FIG. 24 is a typical side view schematically showing a positioning mechanism of a positioning stage of the semiconductor manufacturing mechanism.

A positioning mechanism is placed in the positioning stage E. As shown in FIG. 24, a pair of positioning claws 106, which approaches a square-shaped semiconductor device 1 placed over a stage 105 of the positioning stage E and is spaced away therefrom over one diagonal section 24 of the square semiconductor device 1, is provided in association with the semiconductor device 1. Recesses 107 whose bottoms are formed as right-angle recesses and which correspond to a pair of corners of the square-shaped semiconductor device 1, are respectively provided at the faced leading-end surfaces of the pair of positioning claws 106. Thus, the pair of positioning claws 106 is flexibly moved relative to the center in association with the semiconductor device 1 placed over the stage 105, so that the center of the semiconductor device 1 is positioned to the center of the stage 100, whereby its positioning is completed. Although the positioning is done by means of the pair of two positioning claws in the present embodiment, the present invention is not limited to it. For example, a method of performing positioning by four positioning claws may be adopted.

Figure 25:
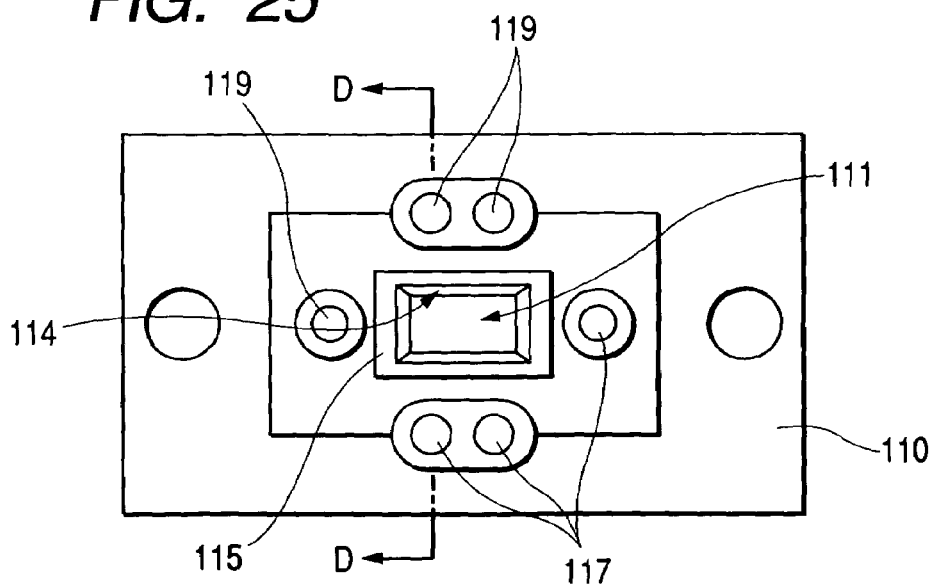
FIG. 25 is a typical side view illustrating a size inspection mechanism of a size inspection stage of the semiconductor manufacturing apparatus.
Figure 26A:
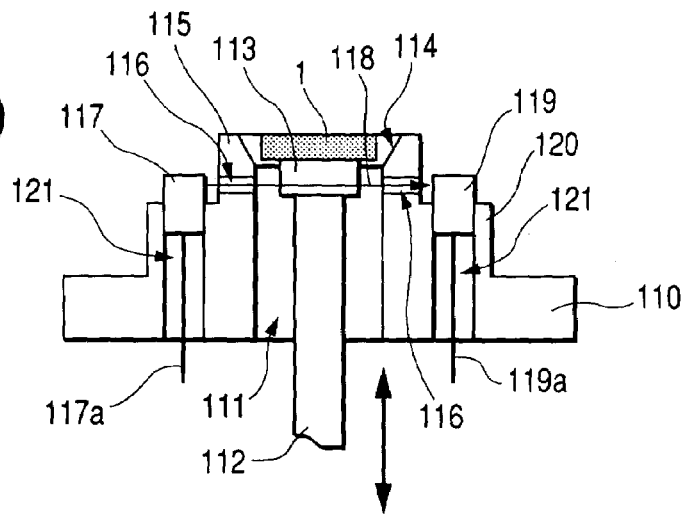
FIGS. 26(a) to 26(c) are typical views showing the operation of the size inspection mechanism.
Figure 26B:
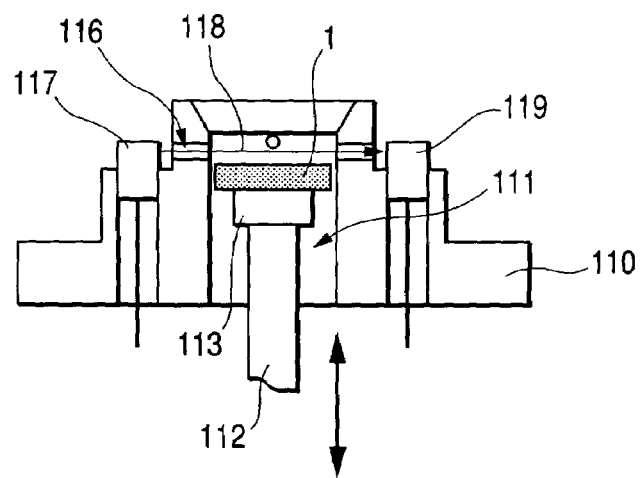
Figure 26C:
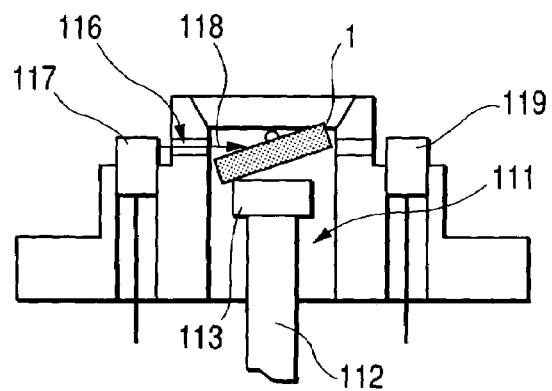

A size detecting mechanism for detecting the size of each semiconductor device is provided in the size detecting stage F. As shown in FIG. 25 and FIGS. 26(*a*) through 26(*c*), a stage 110 of the size detecting stage F has a detection hole 111 having a predetermined size, which penetrates the stage 110 up and down. A vertical shaft 112 controlled so as to move up and down is inserted into the detection hole 111. An upper end of the vertical shaft 112 serves as a base 113, which places the semiconductor device 1 thereon.

A pocket section 114, which guides the semiconductor device 1 toward the center, is provided at the upper end portion of the detection hole 111. The detection hole 111 serves as a hole analogous to the semiconductor device 1, which can be inserted through a slight clearance or gap. The detection hole 111 serves as, for example, a hole larger by about 170 μm than the designed size of the semiconductor device 1. One, which cannot be inserted within the detection hole 111 and is inclined within the detection hole 111 as shown in FIG. 26(*c*), is judged to be defective in size.

The pocket section 114 is formed by quadrangular pyramid-shaped recess analogous to the semiconductor device 1 and guides the semiconductor device 1 conveyed to the stage 111 to the detection hole 111.

The stage 110 is shaped in the form of a cylindrical body whose upper portion becomes thin over two stages. At an upper cylindrical section 115 of the upper stage, a plurality of light-transmitted holes 116 are provided so as to intersect the detection hole 111. In FIGS. 26(*a*) to 26(*c*), three light-transmitted holes 116 are provided. Projectors (light emitters) 117 are provided at the outer ones of the respective light-transmitted holes, whereas photodetectors 119 which receive light 118 emitted from the projectors 117, are provided at the outer others thereof. One light-transmitted hole 111 is provided in one direction, and two light-transmitted holes 111 are provided in parallel in the direction normal to it, thereby enhancing reliability of size detection. The projectors 117 and the photodetectors 119 are mounted above mounting holes 121 defined in the middle cylindrical section 120. Power supply lines 117*a* and 119*a* connected to the projectors 117 and the photodetectors 119 are connected to a control system such as a predetermined controller through the mounting holes 121.

Upon size detection, the semiconductor device 1 is conveyed to the pocket section 114 of the size detecting stage 110. As shown in FIG. 26(*a*), the vertical shaft 112 that accepts the semiconductor device 1 is elevated and stops at a predetermined height, where its upper end is positioned to the lower portion of the pocket section 114.

Therefore, the semiconductor device 1 conveyed within the pocket section 114 is guided to the pocket section 114, so that the semiconductor device 1 is placed over the upper end of the vertical shaft 112.

Next, as shown in FIG. 26(*b*), the vertical shaft 112 is lowered to a predetermined height (reference position). In this state, the light 118 passes over the semiconductor device 1 in the case of the semiconductor device 1 placed closely over the flat base 113 of the vertical shaft 112. Therefore, the light 118 can be received by the corresponding photodetector 119. This light-receivable state is defined as a non-defective product. When the semiconductor device 1 cannot be inserted into the detection hole 111 and is inclined over the base 113 as shown in FIG. 26(*c*), the light 118 emitted from the corresponding projector 117 is struck on the semiconductor device 1 and does not reach the corresponding photodetector 119. This results in size defective information.

Measured information about the size is conveyed to the control system where it is processed. A computing process related to it is performed by the control system to make a decision as to a non-defective/defective product. This information is stored. This results in designation information which sorts the non-defective/defective products by the pickup mechanism which picks up the semiconductor device 1 at the final stage. Thus, the size detection information is also equivalent to one information which determines by the pickup mechanism whether each product is good or bad. If the product is determined as defective, then even ones judged to be non-detective by other detection information are conveyed to a defective product storage unit.

The pickup mechanism is disposed over the size detecting stage F, the non-defective product holding stage G and the defective product holding stage H. The pickup mechanism is configured so as to convey the held semiconductor device 1 to the non-defective product storage unit of the non-defective holding stage G or the defective product storage unit of the defective product holding stage H on the basis of information about whether the flatness of the semiconductor device 1 picked up by the size detecting stage F is good or bad, based on the detection of its flatness by a pickup mechanism to be described later, and go/no-go information of the thickness detection/size detection.

As shown in FIG. 27, a pickup mechanism 124 has a tool (nozzle) 125 which vacuum-adsorbs a semiconductor device 1 onto its lower end surface. The tool 125 is three-dimensionally moved and controlled by a drive unit 126 as shown in FIG. 10. That is, the tool 125 is attached to a leading lower surface of an arm 127 corresponding to part of the drive unit 126. The arm 127 is three-dimensionally moved by the drive unit 126. As shown in FIG. 27, a tubing or pipe arrangement 128 is connected to the tool 125 and a vacuum source 129 is connected to the tubing 128. A solenoid-operated valve 130, which performs an on/off operation by the control system, and a flow throttle valve 131 are connected to the midway points of the tubing 128 in a communicating state. A digital vacuum meter 132, which measures the degree of vacuum in the tool 125, is connected to the tubing 128 between the solenoid-operated valve 130 and the tool 125.

When the semiconductor device 1 is picked up at the size detecting stage F, the degree of vacuum in the tool 125 is measured. In FIG. 27, the stage 10 of the size detecting stage F is simply indicated by a line. The tool 125 adsorbs and holds under vacuum the surface side of an encapsulating body 3 formed of a resin, of the semiconductor device 1. Therefore, the degree of vacuum measured by the digital vacuum meter 132 varies greatly in the case of such a silicone resin that its surface is undulated or waved.

Figure 28A:
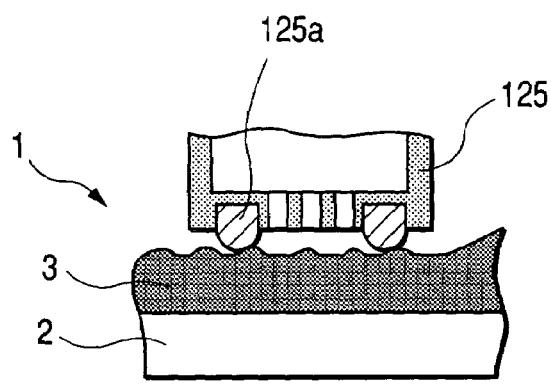
FIGS. 28(a) and 28(b) are typical views showing a vacuum suction state of a product judged as a non-defective product by the pickup mechanism and the state of flatness of a pre-division substrate covered with a resin layer.
Figure 28B:
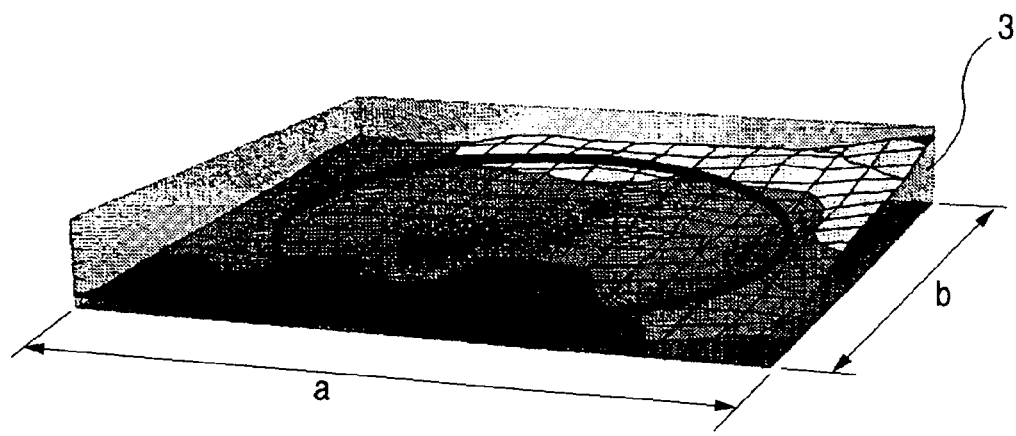

FIGS. 28(a) and 28(b) are typical views showing a vacuum adsorbed state of a product judged as a non-defective product by the pickup mechanism 124 and the state of flatness of the surface of an encapsulating body 3. FIG. 28(b) shows the flatness at a predetermined thickness of the encapsulating body 3. The difference between a low spot and a high spot is less than or equal to 100 µm. Incidentally, the sizes a and b of the encapsulating body 3 in FIG. 28(b) are a=7 mm and b=7 mm, for example.

When the flatness of the surface of a silicone resin, corresponding to the surface of the encapsulating body 3 is satisfactory as shown in FIG. 28(b) where a semiconductor device 1 is adsorbed under vacuum by the vacuum adsorption surface of the lower end of the tool 125, a ring 125a formed of an elastic body, which is lying in the vacuum adsorption surface, contacts the encapsulating body 3 substantially over the full circumference, and vacuum leakage is less reduced, thereby enhancing the degree of vacuum (pressure of vacuum) in the tool 125.

Figure 29A:
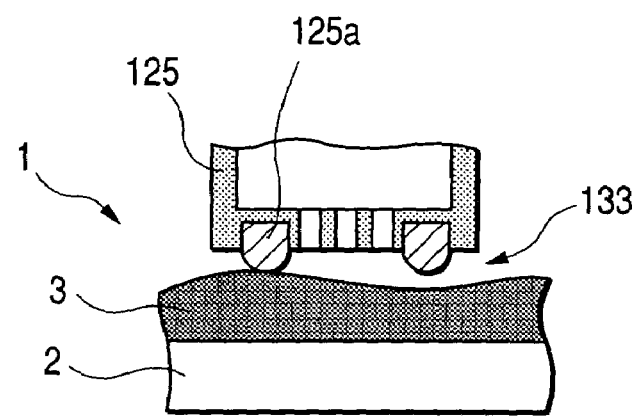
FIGS. 29(a) and 29(b) are typical views showing a vacuum suction state of a product judged as a defective product by the pickup mechanism and the state of flatness of a pre-division substrate covered with a resin layer.
Figure 29B:
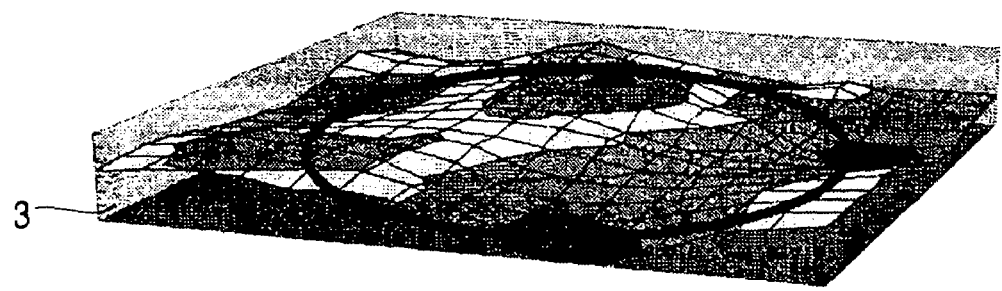

FIGS. 29(a) and 29(b) are typical views showing a vacuum adsorbed state of a product judged as a defective product by the pickup mechanism 124 and the state of flatness of the surface of an encapsulating body 3. FIG. 29(b) shows the flatness at a predetermined thickness of the encapsulating body 3. The difference between a low spot and a high spot reaches 150 µm.

When the flatness of the surface of a silicone resin, corresponding to the surface of the encapsulating body 3 is not satisfactory as shown in FIG. 29(b) where a semiconductor device 1 is adsorbed under vacuum by the vacuum adsorption surface of the lower end of the tool 125, some of a ring 125a is not brought into contact with the encapsulating body 3 and a gap 133 defined therebetween also becomes large. Thus, atmosphere air flows into the tool 125 so that the degree of vacuum (pressure of vacuum) in the tool 125 is reduced.

Therefore, the degree of vacuum in the tool 125 is measured. Information about the measured degree of vacuum is sent to the control system. The control system judges the semiconductor device 1 as a flatness defective product where the degree of vacuum is a degree of vacuum less than the predetermined reference degree of vacuum, judges the semiconductor device 1 as a non-defective product where the degree of vacuum is a degree of vacuum greater than or equal to the reference degree of vacuum, and controls the pickup mechanism based on the results of judgements referred to above.

On the other hand, a tray 135 is placed in the non-defective product holding stage G as a non-defective product storage unit. A defective product storage box 136 is placed in the defective product holding stage H as a defective product storage unit. Thus, when any of the thickness detection information, size detection information and flatness detection information is regarded as defective, the pickup mechanism 124 conveys the corresponding semiconductor device 1 to the defective product storage box 136 under the control of the control system. When all the information are judged as satisfactory, the corresponding semiconductor device 1 is accommodated in the tray 125 as a non-defective product. As shown in FIG. 10, a rack 138 for holding or accommodating the tray 135 is placed in the non-defective product holding stage G. The tray 135 is pitch-fed from the rack to a non-defective product storage position. When the tray 135 becomes full, it is delivered to a tray recovery table 139. The tray 135 lying on the tray recovery table 139 is transferred to a predetermined location.

According to the first embodiment, the following advantageous effects are brought about.

(1) A resin layer 3a formed by printing of a silicone resin is printed and thereafter subjected to defoaming processing and curing processing (bake processing). A heavy substance such as a filler contained in a resin at the defoaming processing long in processing time sinks from the upper surface side to the substrate (wiring board) 2a side at its lower surface. As a result, the surface of the resin layer 3a is brought to a layer of a resin component hard to tear off. Thus, a compression force merely acts on the layer of the resin component in the surface layer of the resin layer 3a even if the substrate 2a is divided, in the case of such a division that the substrate 2a is folded back to the resin layer 3a side. Therefore, the resin portion remains without the division of the substrate 2a (non-divided resin portion remains). In a dividing method and a semiconductor manufacturing apparatus according to the present invention, a protruded wiring board portion 2j of a wiring board (substrate 2a, strip body 2g) formed of ceramic is forced up (upper swing) by means of a lower clamp claw 58 of a clamper 59, and some of the protruded wiring board portion 2j is pressed against a support body to carry out a first division under bending stress. Thereafter, the upward-located clamper 59 is rotatably swung (lower swing) downward to allow an upper clamp claw 57 to press down the protruded wiring board portion 2j, thereby performing a reverse division at the first division section again as a second division. Since the second division allows a tensile force to act on a remaining and thin non-divided resin portion 3s, the non-divided resin portion 3s is torn off. Thus, the perfect division is enabled. Fractionalizing is done by a one-row division and an individual division so that each semiconductor device 1 is manufactured.

(2) In the one-row division and the individual division, the division position of each wiring board is determined at a fulcrum 56a, and division positions (division lines) are determined by division grooves 2p defined in the wiring board. Therefore, it is possible to make constant the size of a finally-formed semiconductor device 1. Thus, the reliability of mounting at users is enhanced.

(3) Since the cut residual of the resin layer 3a is set to less than or equal to 0.1 mm upon the upper swing, the wiring board can be separated without applying a load than required to the wiring board upon the lower swing.

Accordingly, a resin package product stable even in view of the quality can be provided.

(4) The semiconductor manufacturing apparatus according to the present embodiment has a structure in which the clamper 59 that forces up the protruded wiring board portion 2*j* or presses down the protruded wiring board portion 2*j* do not hold the protruded wiring board portion 2*j* with the protruded wiring board portion 2*j* being directly pinched thereby. Although the wiring board placed over the conveying chute 55 is also held with being interposed between the conveying chute 55 and the fulcrum 56*a* of the support body 56, no electronic part exists in this division section. Owing to these, the division can be performed without damaging the wiring board and mounting parts, and hence a resin package product excellent in quality can be provided.

According to the first embodiment as apparent from the above (1) through (4), a failure in division is hard to occur, and a high reliable semiconductor device can be provided. It is also possible to achieve yield enhancement. As a result, a semiconductor device excellent in quality can be provided at low cost. It is possible to provide, for example, a semiconductor device for a cellular phone.

(5) In the semiconductor manufacturing apparatus according to the first embodiment, a pickup mechanism 124, which conveys products brought to semiconductor devices 1 by being fractionized, vacuum-adsorbs and holds a semiconductor device 1 at a final stage by a tool 125 but measures the degree of vacuum in its held state. Then, the pickup mechanism 124 is controlled based on information about the degree of vacuum. When the measured degree of vacuum is greater than or equal to the reference degree of vacuum, the pickup mechanism 124 conveys the semiconductor devices 1 to the corresponding non-defective product storage unit. When the degree of vacuum is less than the reference degree of vacuum, the pickup mechanism 124 conveys the semiconductor devices 1 to the corresponding defective product storage unit. Thus, only products in each of which the flatness of the surface of an encapsulating body 3 is satisfactory, can be shipmented. As a result, the pickup of each semiconductor device 1 is done reliably upon the work of mounting of the semiconductor device 1 by a user, thus making it possible to carry out satisfactory mounting.

(6) The semiconductor manufacturing apparatus according to the present embodiment has an excellent feature in that a substrate 2*a* whose surface is provided with a fail mark in a state being formed with a resin layer 3*a*, is detected in a state of a strip body 2*g*, and when the strip body 2*g* is divided and fractionalized, the fractionalized ones can be selected and eliminated.

(7) The semiconductor manufacturing apparatus according to the present embodiment has another excellent feature in that since the thickness of each individualized semiconductor device 1 can be detected and each defective product can be eliminated by the pickup mechanism 124, only non-defective products can be accommodated into the tray 135.

(8) The semiconductor manufacturing apparatus according to the present embodiment has a further excellent feature in that since the size of each individualized semiconductor device 1 can be detected and each defective product can be eliminated by the pickup mechanism 124, only non-defective products can be accommodated in the tray 135.

(9) The semiconductor manufacturing apparatus according to the present embodiment is capable of accurately and reliably dividing the substrate 2*a* and the strip body 2*g*. Semiconductor devices 1 with fail marks attached thereto in advance can be eliminated upon fractionalization. Further, the pickup mechanism 124 is capable of performing defective product elimination, based on thickness detection information, size detection information and flatness detection information detected at respective detecting stages. Thus, the semiconductor manufacturing apparatus according to the present embodiment has a still further excellent feature in that a semiconductor device 1 excellent in quality can be manufactured with high yields.

(10) The implementation of automatic division enables mass production of resin package products, makes it easy to enlarge a mounting area around a substrate and adapt to its size, and makes it possible to adapt to a size reduction and package diversification.

(11) With the use of the semiconductor manufacturing apparatus according to the first embodiment, the manufacture of a low elastic resin-sealed product can also be established which is capable of preventing a short caused by re-melting of solder within the encapsulating body 3 upon secondary mounting by customers.

(12) With the use of the semiconductor manufacturing apparatus according to the first embodiment, it is possible to improve the quality of a semiconductor device and reduce the machining cost thereof.

(13) With the use of the semiconductor manufacturing apparatus according to the first embodiment, a high frequency module product can also be reduced in cost.

(14) With the use of the semiconductor manufacturing apparatus according to the first embodiment, TAT (Turn around Time: product development period) can be shortened.

(15) Laser- or dicing-based division involves the problem that a cut section becomes white due to the fly-off and adhesion of cuttings or chips and the cutting of contained silica. In contrast, the present embodiment is capable of obtaining a clean divided surface.

Second Preferred Embodiment

Figure 30A:
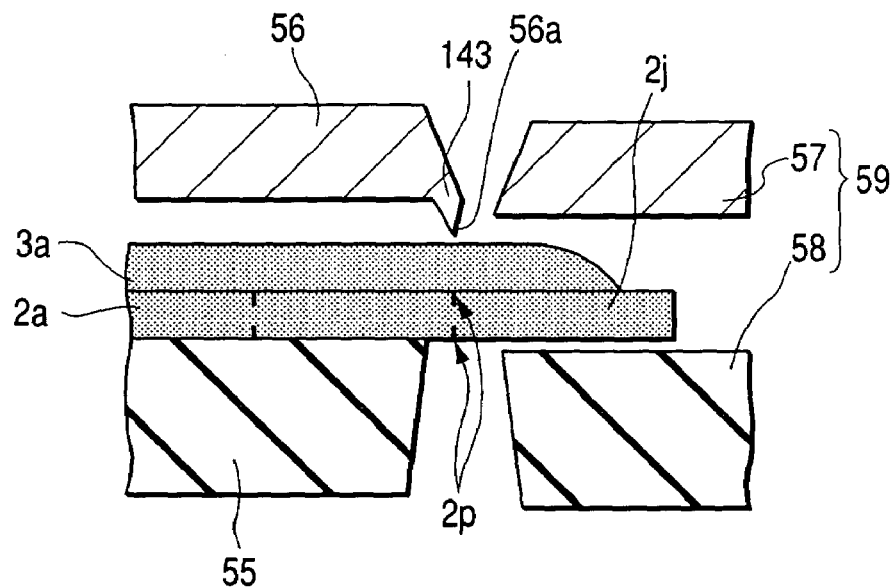
FIGS. 30(a) and 30(b) are typical views illustrating a dividing mechanism employed in a semiconductor manufacturing apparatus showing a second embodiment of the present invention and a state of division by the dividing mechanism.

A second embodiment shows an example in which in a semiconductor manufacturing apparatus, the division of a wiring board is made satisfactory and the position to divide the wiring board can be set accurately. FIGS. 30(*a*) and 30(*b*) is a typical view illustrating a cutting mechanism for cutting a substrate covered with a resin layer and its cut state.

Figure 31:
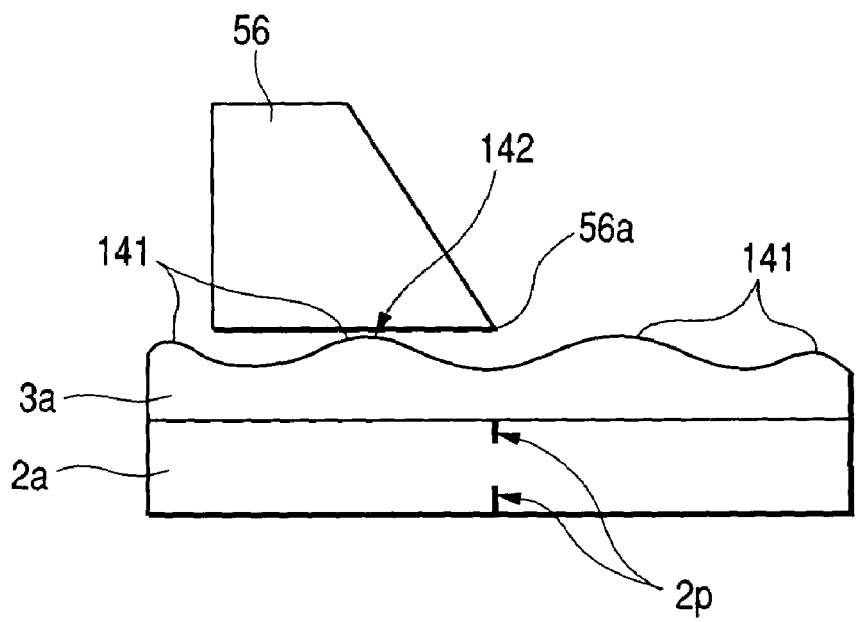
FIG. 31 is a typical view showing a state in which a division position of a substrate cannot be determined.

As described in the first embodiment, the surface of the resin layer 3*a* formed by printing is low in flatness due to an undulation or the like. When the undulation is large, a resin layer 3*a* is not brought into contact with a fulcrum 56*a* of a support body 56 when a protruded wiring board portion 2*j* of a substrate 2*a* is forced up, and a top portion 142 of an undulation 141 comes into contact with the lower surface of the support body 56, as shown in FIG. 31. It has turned out that since the position to which a dividing force is applied, does not correspond to the position of the fulcrum 56*a* in such a case, the division does not necessarily start from the position of each division groove 2*p* even if the division groove 2*p* is located substantially directly below the fulcrum 56*a*, thereby causing the fear that the division position is not specified.

The second embodiment shows the technique of resolving the above failure in division. In the second embodiment, the support body 56 is configured such that a lower surface thereof provided face-to-face to a conveying chute 55 becomes a flat surface as shown in FIG. 30(*a*). A protruding strip body 143, which protrudes toward the conveying chute 55, is provided at the right end of the lower surface of the support body 56. The protruding strip body 143 takes such a tapered section that it becomes thin gradually downward. The protruding strip body 143 is made wide so as to be capable of linearly contacting and supporting a wide substrate 2*a* and a strip body 2*g* for the purpose of their division. The leading edge of the protruding strip body 143 forms a fulcrum 56*a*.

Figure 30B:
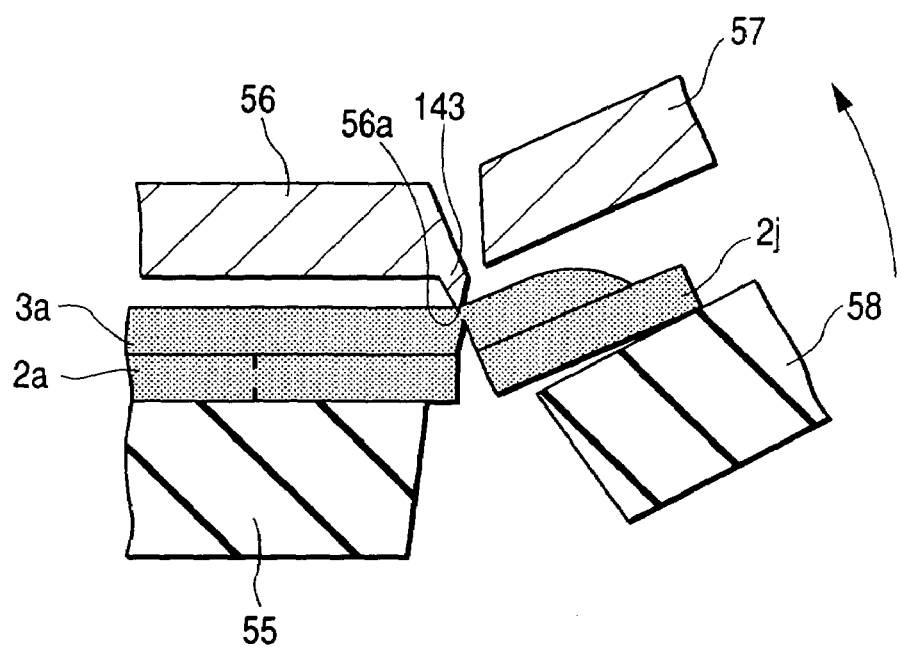

According to such a division mechanism, when a clamper 59 is swung upward as shown in FIG. 30(b), a lower clamp claw 58 forces up a protruded wiring board portion 2j. With its upper swing, the fulcrum 56a corresponding to the leading end of the protruding strip body 143 is first brought into contact with the surface of a resin layer 3a. Since the leading end of the protruding strip body 143 is sharp, the protruding strip body 143 is engaged in the resin layer 3a in some degree. However, the position where it is engaged therein, corresponds to such a position as to face each division groove 2p. Therefore, division can be performed at the division grooves 2p accurately and reliably. Thus, the size of a semiconductor device 1 is always kept constant.

As is understood from the above description, the protruded length of the protruding strip body 143 is set to such a length that the surface of the resin layer 3a is not brought into contact with the lower surface of the support body 56 in a state in which the leading end of the protruding strip body 143 has been brought into contact with the grooves (division grooves) 2p and engaged therein.

Figure 32:
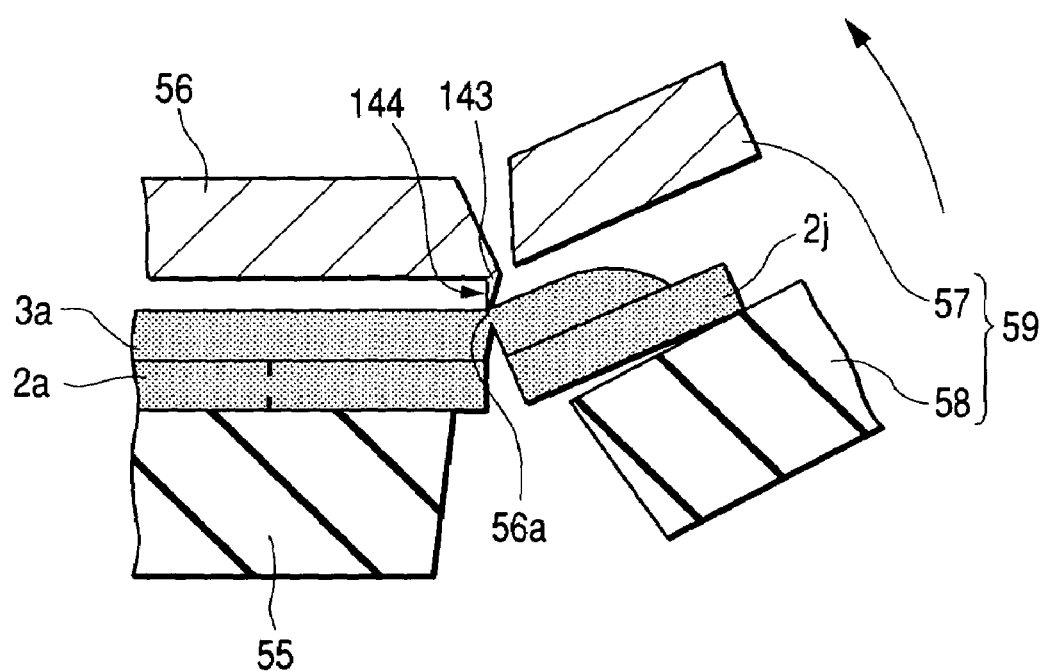
FIG. 32 is a typical view showing a state of division by a dividing mechanism illustrative of a modification of the second embodiment of the present invention.

FIG. 32 shows a modification of the second embodiment of the present invention. The present example serves as a mechanism considered in such a manner that one surface of a protruding surface of a protruding strip body 143 is set to a surface normal to an upper surface of a conveying chute 55, and the top or protruding portion of an undulation of a resin layer 3a is made hard to contact a lower surface of a support body 56 connected to its vertical surface 144 and the vertical surface 144, thereby carrying out partition satisfactorily.

While the invention made above by the present inventors has been explained specifically based on the embodiments, the present invention is not limited to the embodiments. It is needless to say that various changes can be made thereto within the scope not departing from the gist thereof.

What is claimed is:

1. A method of manufacturing a semiconductor device, comprising the steps of:
   (a) preparing a wiring board including a plurality of areas;
   (b) mounting electronic parts in the plurality of areas respectively;
   (c) sealing the plurality of areas with an insulating resin after said step (b);
   (d) placing the wiring board over a base after said step (c);
   (e) after said step (d), placing a first device part used as a fulcrum among the plurality of areas adjacent to one another lying over the wiring board and moving one end of the wiring board above the base to thereby cut part of the wiring board; and
   (f) after said step (e), moving the one end of the wiring board downwardly of the base and cutting the resin to separate one of the plurality of areas.

2. The method according to claim 1, wherein in said step (b), the electronic parts are mounted over the wiring board by solder.

3. The method according to claim 2, wherein the insulating resin has an elastic modulus of 200 MPa or less at a temperature greater than or equal to 150° C.

4. The method according to claim 3, wherein the insulating resin comprises a silicone resin.

5. The method according to claim 4,
   wherein in said step (e), a second device part that covers an upper surface and a lower surface of the one end of the wiring board is rotated by an angle of 80° or more about the fulcrum from an upper surface of the base to an upward direction, and
   wherein in said step (f), the second device part is rotated by an angle of 10° or more about the fulcrum from the upper surface of the base to a downward direction.

6. The method according to claim 2, wherein the insulating resin has an elastic modulus ranging from over 1 MPa to under 200 MPa at a temperature of 150° C. or higher and has an elastic modulus of 200 MPa or more at a temperature of 25° C.

7. The method according to claim 6, wherein the insulating resin comprises an epoxy resin.

8. The method according to claim 4,
   wherein in said step (e), the second device part is rotated by an angle of 30° or more about the fulcrum from the upper surface of the base to the upward direction, and
   wherein in said step (f), the second device part is rotated by an angle of 10° or more about the fulcrum from the upper surface of the base to the downward direction.

9. The method according to claim 2, wherein a predetermined space is provided with respect to a shortest distance between an upper surface of the wiring board and the first device part used as the fulcrum.

10. The method according to claim 2,
    wherein said step (e) includes moving the one end of the wiring board upward by the second device part, which covers the upper and lower surfaces of the one end of the wiring substrate, in a state in which a predetermined space is provided with respect to a shortest distance between the upper surface of the wiring board and the second device part,
    wherein said step (f) includes moving the one end of the wiring board downward in a state in which a predetermined space is provided with respect to a shortest distance between a lower surface of the wiring board and the second device part.

11. The method according to claim 1, wherein the semiconductor device includes a power amplifier device operated at an operating frequency of 800 MHz or more.

12. The method according to claim 2, wherein the electronic parts include passive elements and active elements formed over a semiconductor substrate.

13. The method according to claim 2,
    wherein the plurality of areas lying over the wiring board are arranged in matrix form, and
    wherein in said step (c), the insulating resin is formed by a printing method.

14. The method according to claim 2, wherein the wiring board comprises ceramic.

15. The method according to claim 2, wherein a step for defining grooves in a surface of the resin among the plurality of areas adjacent to one another is provided between said steps (c) and (e).

* * * * *